(12) United States Patent
Sato

(10) Patent No.: US 6,294,404 B1
(45) Date of Patent: Sep. 25, 2001

(54) SEMICONDUCTOR INTEGRATED CIRCUIT HAVING FUNCTION OF REDUCING A POWER CONSUMPTION AND SEMICONDUCTOR INTEGRATED CIRCUIT SYSTEM COMPRISING THIS SEMICONDUCTOR INTEGRATED CIRCUIT

(75) Inventor: Hirotoshi Sato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/568,058

(22) Filed: May 10, 2000

(30) Foreign Application Priority Data

Nov. 30, 1999 (JP) .............................. 11-339609(P)

(51) Int. Cl.[7] .................................................. H01L 21/44
(52) U.S. Cl. ........................... 438/106; 438/900; 438/910; 438/903; 307/56; 307/64; 307/80; 307/544; 327/544
(58) Field of Search .................................... 438/106, 903, 438/900, 910; 307/64, 56, 80, 544; 327/544

(56) References Cited

U.S. PATENT DOCUMENTS 5,265,060 * 11/1993 Miyaoka .............................. 365/208
5,543,649 * 8/1996 Kim et al. ............................ 257/355
5,898,235 * 4/1999 McClure ............................... 307/64
5,955,904 * 9/1999 Kawasaki ............................. 327/156

FOREIGN PATENT DOCUMENTS 10-214487    8/1998  (JP) .

* cited by examiner

*Primary Examiner*—Richard Elms
*Assistant Examiner*—Pho Luu
(74) *Attorney, Agent, or Firm*—McDermott, Will & Emery

(57) ABSTRACT

A semiconductor integrated circuit according to the present invention comprises a synchronous SRAM, a signal generation circuit generating a chip selection signal, a clock signal etc. supplied to the synchronous SRAM, a voltage set circuit setting the voltage of a system power supply line and a controller controlling the signal generation circuit and the voltage set circuit. When setting the synchronous SRAM in a power down mode, the chip selection signal is set in a nonselective state and the power supply voltage of the system power supply line is stepped down to a standby potential. Thus, the synchronous SRAM enters a standby state having extremely low power consumption.

20 Claims, 37 Drawing Sheets

FIG.18

SEMICONDUCTOR INTEGRATED CIRCUIT HAVING FUNCTION OF REDUCING A POWER CONSUMPTION AND SEMICONDUCTOR INTEGRATED CIRCUIT SYSTEM COMPRISING THIS SEMICONDUCTOR INTEGRATED CIRCUIT

BACKGROUND OF THE INVENTION

1. Field of the Invention

The present invention relates to a semiconductor integrated circuit and a semiconductor integrated circuit system, and more specifically, it relates to a structure for reducing power consumption.

2. Description of the Prior Art

A data hold mode in a conventional asynchronous SRAM (SRAM: Static Random Access Memory) is described with reference to FIG. 35. In order to set the SRAM in the data hold mode, a chip selection signal /CS is set in a nonselective state (high) for taking a setup period tsu(PD) and a power supply voltage Vdd is stepped down to a data hold mode voltage. The SRAM is set in the data hold mode having low power consumption due to the step-down of the voltage applied thereto.

In order to return the SRAM from the data hold mode to an operating mode, the power supply voltage Vdd is returned to an operating voltage and the chip selection signal /CS is returned to a selective state (set low) through a recovery time trec(PD).

FIGS. 36A and 36B illustrate exemplary input circuits 200 and 201 included in the asynchronous SRAM. The input circuit 200 includes PMOS transistors P50 and P51 and NMOS transistors N50 and N51. The transistors P50, N50 and N51 are connected between a power supply node Vdd receiving the operating voltage and ground power. The gates of the transistors P50 and N50 receive an input signal to be captured. A signal from a node Z50 between the transistors P50 and N50 is transferred to an internal circuit. The gate of the transistor N51 receives an internal chip selection signal (internal CS signal) corresponding to a chip selection signal /CS. The transistor P51 is connected between the node Z50 and a power supply node Vdd, and receives the internal CS signal in the gate thereof.

The input circuit 201 includes PMOS transistors P52 and P53 and NMOS transistors N52 and N53. The transistors P52, P53 and N53 are connected between a power supply node Vdd and ground power. The gates of the transistors P53 and N53 receive an input signal to be captured. A signal from a node Z51 between the transistors P53 and N53 is transferred to an internal circuit. The gate of the transistor P52 receives a signal (internal /CS signal) obtained by inverting an internal chip selection signal. The transistor N52 is connected between the node Z51 and the ground power, and receives the internal /CS signal in the gate thereof. When a chip selection signal is nonselective, the input initial stage is inactivated so that no current flows regardless of the input signal.

A synchronous SRAM has a snooze mode, in order to suppress power consumption. The snooze mode is now described with reference to FIG. 37. FIG. 37 shows a clock signal CLK, a snooze mode signal ZZ, an address status controller signal /ADSC, a write enable signal /WE and an output enable signal /OE as input signals.

In order to set the SRAM in the snooze mode, the control signals excluding the snooze mode signal ZZ are inactivated and thereafter the snooze mode signal ZZ is activated (high). The SRAM enters a snooze state after a lapse of a setup time.

In the snooze state, fluctuation of the signals excluding the output enable signal /OE exerts no influence on the SRAM. In the smooth mode, the SRAM has low power consumption regardless of external signals.

In order to return the SRAM from the snooze mode to an operating mode, the snooze mode signal ZZ is set low. The synchronous SRAM becomes operable after a lapse of a recovery time.

FIGS. 38A and 38B illustrate exemplary input circuits 202 and 203 having a snooze mode function included in the synchronous SRAM. The input circuit 202 includes PMOS transistors P54 and P55 and NMOS transistors N54 and N55. The transistors P54, N54 and N55 are connected between a power supply node Vdd and ground power. The gates of the transistors P54 and N54 receive an input signal to be captured. A signal from a node Z52 between the transistors P54 and N54 is transferred to an internal circuit. The gate of the transistor N55 receives an internal snooze mode signal (internal ZZ signal) corresponding to the snooze mode signal ZZ. The transistor P55 is connected between the node Z52 and a power supply node Vdd, and receives the internal ZZ signal in the gate thereof.

The input circuit 203 includes PMOS transistors P56 and P57 and NMOS transistors N56 and N57. The transistors P56, P57 and N57 are connected between a power supply node Vdd and ground power. The gates of the transistors P57 and N57 receive an input signal to be captured. A signal from a node Z53 between the transistors P57 and N57 is transferred to an internal circuit. The gate of the transistor P56 receives a signal (internal /ZZ signal) obtained by inverting an internal snooze mode signal. The transistor N56 is connected between the node Z53 and the ground power, and receives the internal /ZZ signal in its gate. In the snooze mode, the input initial stage is inactivated so that no current flows regardless of the input signal. The chip selection signal /CS and the snooze mode signal ZZ may be ANDed when generating the internal ZZ signal.

A power down mode of a synchronous DRAM (DRAM: Dynamic Random Access Memory) is now described with reference to FIG. 39. FIG. 39 shows a clock signal CLK and a clock enable signal CKE as input signals.

In the power down mode, the clock enable signal CKE is set low thereby inactivating an internal clock of the device and suppressing power consumption of the device.

Thus, both of synchronous and asynchronous memory chips have a function for enabling suppression of power consumption.

However, the conventional synchronous SRAM still consumes power of about several mW in the snooze mode, and reduction of power consumption is insufficient for applying the synchronous SRAM to a portable terminal or the like.

In the asynchronous SRAM, power consumption can be suppressed due to the data hold mode. In actual operation, however, the SRAM receives no signal for performing a synchronous operation and hence an ATD (address transition detect) circuit or a DTD (data transition detect) circuit must be provided in the SRAM for generating internal write and read control signals. Such a specific circuit increases the operating current as a result. Further, it is difficult to design a circuit finely controlling the internal timing.

In addition, a signal forming the basis of a read timing is internally generated. Therefore, a sense amplifier based on a current mirror type having a low possibility of false reading is employed so that data can be reliably read from a memory cell in consideration of timing deviation. In this case, however, current must be regularly fed to result in feeding of excess current.

In the synchronous SDRAM, power consumption must be reduced not only in the power down mode but also in an operating mode.

SUMMARY OF THE INVENTION

Accordingly, an object of the present invention is to provide a semiconductor integrated circuit and a semiconductor integrated circuit system capable of reducing power consumption in a standby state as well as in an operating state.

A semiconductor integrated circuit according to an aspect of the present invention comprises a static semiconductor memory device selected in response to a chip selection signal for operating in synchronization with a clock signal and a controller for controlling operations of the static semiconductor memory device, and the controller switches the static semiconductor memory device to a power down mode by switching the chip selection signal to a nonselective state and thereafter stepping down a power voltage supplied to the static semiconductor memory device from an operating power supply potential to a standby potential.

According to the aforementioned semiconductor integrated circuit, a synchronous SRAM can be set in a standby state having extremely low power consumption by switching the chip selection signal to the nonselective state and thereafter stepping down the power supply voltage.

Preferably, the controller steps down the power supply voltage to the standby potential after a lapse of a first prescribed period after switching the chip selection signal to the nonselective state when switching the static semiconductor memory device to the power down mode and switches the chip selection signal to a selective state after a lapse of a second prescribed period from stepping up the power supply voltage to the operating potential when switching the static semiconductor memory device from the power down mode to an operating mode. In particular, the controller stops change of a control signal supplied to the static semiconductor memory device when switching the static semiconductor memory device to the power down mode.

According to the aforementioned semiconductor integrated circuit, the static semiconductor memory device can be returned to the operating mode by switching the chip selection signal to the selective state and stepping up the power supply voltage to the operating potential.

Preferably, the controller fixes the clock signal to a prescribed level after a lapse of a first prescribed period after switching the chip selection signal to the nonselective state and steps down the power supply voltage to the standby potential after a lapse of a second prescribed period when switching the static semiconductor memory device to the power down mode. Further, the controller generates the clock signal after a lapse of a third prescribed period after stepping up the power supply voltage to the operating potential and switches the chip selection signal to the selective state after a lapse of a fourth prescribed period when switching the static semiconductor memory device from the power down mode to the operating mode.

According to the aforementioned semiconductor integrated circuit, the static semiconductor memory device can be set in a standby state having extremely low power consumption in the power down mode. Further, the static semiconductor memory device can be returned to the operating state by generating the clock signal after a lapse of a prescribed period after stepping up the power supply voltage and further switching the chip selection signal to the selective state after a lapse of a prescribed period.

Preferably, the controller steps down the power supply voltage to the standby potential after a lapse of a first prescribed period after switching the chip selection signal to the nonselective state and fixes the clock signal to a prescribed level after a lapse of a second prescribed period when switching the static semiconductor memory device to the power down mode. Further, the controller generates the clock signal, steps up the power supply voltage to the operating potential after a lapse of a third prescribed period and switches the chip selection signal to the selective state after a lapse of a fourth prescribed period when switching the static semiconductor memory device from the power down mode to the operating mode.

According to the aforementioned semiconductor integrated circuit, the static semiconductor memory device can be set in a standby state having extremely low power consumption in the power down mode. Further, the static semiconductor memory device can be returned to the operating state by stepping up the power supply voltage after a lapse of a prescribed period after generating the clock signal and further switching the chip selection signal to the selective state after a lapse of a prescribed period.

Preferably, the semiconductor integrated circuit further comprises a sense circuit for sensing whether or not the power supply voltage is stepped down beyond a sense level, the static semiconductor memory device includes an input buffer capturing an input signal, and the input buffer is inactivated on the basis of a sense result of the sense circuit. In particular, the sense circuit includes a set potential sense circuit including a first PMOS transistor having a gate receiving a reference potential and a source node receiving the power supply voltage and a diode-connected NMOS transistor connected between a drain node of the first PMOS transistor and a ground potential, a reference potential generation circuit including a second PMOS transistor having a source node receiving the power supply voltage and a drain node and a gate connected with each other and a capacitive element and a resistive element connected in parallel between the drain node of the second PMOS transistor and a ground potential, and a differential compare circuit outputting a signal indicating whether or not the power supply voltage is stepped down beyond the total of the threshold of the NMOS transistor and the threshold of the second PMOS transistor on the basis of a signal from the drain node of the first PMOS transistor and a signal from the drain node of the second PMOS transistor.

According to the aforementioned semiconductor integrated circuit, the input buffer is inactivated in response to the sense result output from the circuit sensing step-down of the power supply voltage. Thus, the static semiconductor memory device can be set in a standby state having extremely low power consumption.

A semiconductor integrated circuit system according to another aspect of the present invention comprises a static semiconductor memory device selected in response to a chip selection signal for operating in synchronization with a clock signal, a backup circuit supplying backup power to the static semiconductor memory device following step-down of a power supply voltage supplied to the static semiconductor memory device, a stabilizing circuit for stepping down the power supply voltage when the power supply voltage is stepped up beyond a prescribed value, a backup controller sensing abrupt step-down of the power supply voltage and switching the chip selection signal to a nonselective state and a controller for switching the static semiconductor memory device to a power down mode/operating mode. In particular, the controller switches the chip selection signal to the nonselective state in the power down mode.

According to the aforementioned semiconductor integrated circuit system, the overall system including a synchronous SRAM can be set in a state having extremely low power consumption by switching the chip selection signal to the nonselective state in the power down mode. Further, a memory chip can be protected by arranging the backup circuit supplying the backup power to the memory chip for protecting stored data when the power supply voltage is stepped down and the stabilizing circuit stepping down the power supply voltage when the power supply voltage is stepped up beyond a fixed value.

In particular, the semiconductor integrated circuit system further comprises a first power supply node for supplying the power supply voltage and a second power supply node electrically connected with the static semiconductor memory device, the backup controller includes a detection circuit detecting a voltage drop on the first power supply node and a circuit switching the chip selection signal to the nonselective state in response to a result of detection of the detection circuit, the backup circuit includes a power supply circuit and a first zener diode turned on following step-down of the power supply voltage for electrically connecting the power supply circuit and the second power supply node with each other, and the stabilizing circuit includes a first bipolar transistor connected between the first power supply node and the second power supply node, a second bipolar transistor turned on in response to the result of detection of the detection circuit, a resistive element connected between the base of the first bipolar transistor and the collector of the second bipolar transistor, and a second zener diode connected between the emitter of the second bipolar transistor and ground power.

In particular, a clock stop operation is performed in the power down mode. Thus, the memory chip can be set in a state having extremely low power consumption.

In particular, the controller switches a snooze mode signal for setting the static semiconductor memory device in a snooze mode to an active state when switching the static semiconductor memory device to the power down mode.

Thus, the memory chip can be set in a state having extremely low power consumption.

A semiconductor integrated circuit according to a further aspect of the present invention comprises a generation circuit generating a first internal clock synchronous with an external clock and a second internal clock obtained by delaying the first internal clock, a memory cell array including memory cells arranged in rows and columns, a plurality of word lines corresponding to the rows and a plurality of pairs of bit lines corresponding to the columns and a word line activation signal generation circuit activating a word line activation signal supplied to a selected word line, and the word line activation signal generation circuit decides an active period of the word line activation signal in response to edges of the first internal clock and the second internal clock.

According to the aforementioned semiconductor integrated circuit, the active period of the word line is controlled in response to combination of the two internal clocks synchronous with the external clock. Thus, power consumption can be reduced in operation.

Preferably, the word line activation signal generation circuit activates the word line activation signal on the leading edge of the first internal clock.

In particular, the word line activation signal generation circuit inactivates the word line activation signal on the leading edge of the second internal clock or on the next leading edge of the first internal clock.

According to the aforementioned semiconductor integrated circuit, the word line activation signal can be activated on the leading edge of the first internal clock, and inactivated in response to the edge of the first internal clock or the second internal clock.

Preferably, the word line activation signal generation circuit activates the word line activation signal on the leading edge of the second internal dock.

In particular, the word line activation signal generation circuit inactivates the word line activation signal on the trailing edge of the first internal clock.

According to the aforementioned semiconductor integrated circuit, the word line activation signal can be activated on the leading edge of the second internal clock, and inactivated in response to the edge of the first internal clock.

Preferably, the word line activation signal generation circuit includes a first signal generation circuit activating a first word line activation signal supplied to a word line subjected to a write operation of the memory cell array and a second signal generation circuit activating a second word line activation signal supplied to a word line subjected to a read operation of the memory cell array, and an active period of the first word line activation signal is shorter than an active period of the second word line activation signal.

According to the aforementioned semiconductor integrated circuit, the active period of the word line subjected to the write operation can be shortened in particular. Thus, power consumption can be reduced in the write operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 illustrates a semiconductor integrated circuit system according to a tenth embodiment of the present invention;

DESCRIPTION OF THE PREFERRED EMBODIMENTS

Figure 1:
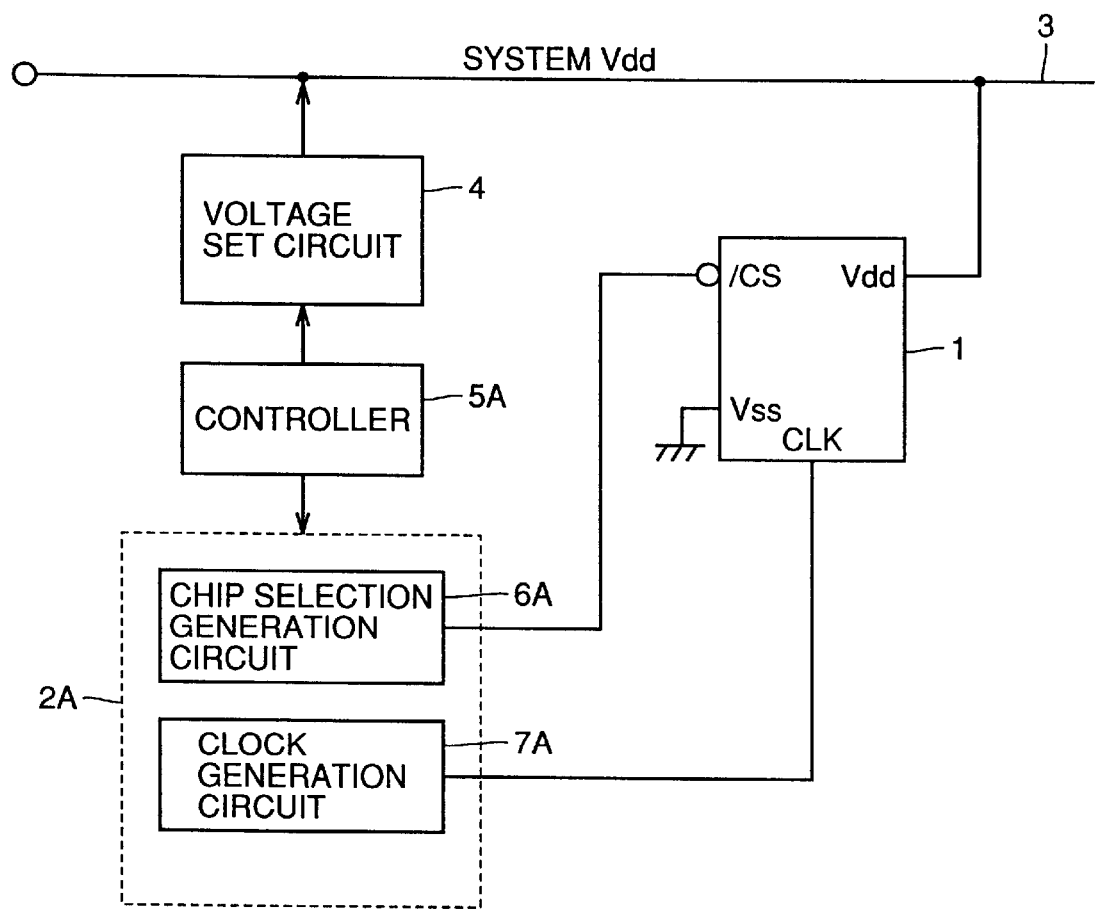
FIG. 1 illustrates the outline of the structure of a semiconductor integrated circuit according to a first embodiment of the present invention.

Embodiments of the present invention are now described in detail with reference to the drawings. Referring to the drawings, parts identical or corresponding to each other are denoted by the same reference numerals and redundant description is not repeated.

First Embodiment

A semiconductor integrated circuit according to a first embodiment of the present invention is described with reference to FIG. 1. The semiconductor integrated circuit shown in FIG. 1 comprises a synchronous SRAM 1, a signal generation circuit 2A for supplying control signals to the synchronous SRAM 1, a system power supply line 3, a voltage set circuit 4 setting the voltage (system power Vdd) of the system power supply line 3 and a controller 5A controlling voltage setting in the voltage set circuit 4 and signal generation in the signal generation circuit 2A.

The signal generation circuit 2A generates the control signals controlling operations of the synchronous SRAM 1 on the basis of control by the controller 5A. FIG. 1 representatively illustrates a chip selection generation circuit 6A generating a chip selection signal /CS and a clock generation circuit 7A generating a clock signal CLK as components of the signal generation circuit 2A.

The synchronous SRAM 1 is selected in response to the chip selection signal /CS and executes operations responsive to the control signals received from the signal generation circuit 2A in synchronization with the clock signal CLK. The synchronous SRAM 1 operates with the power Vdd received through the system power supply line 3.

Figure 2:
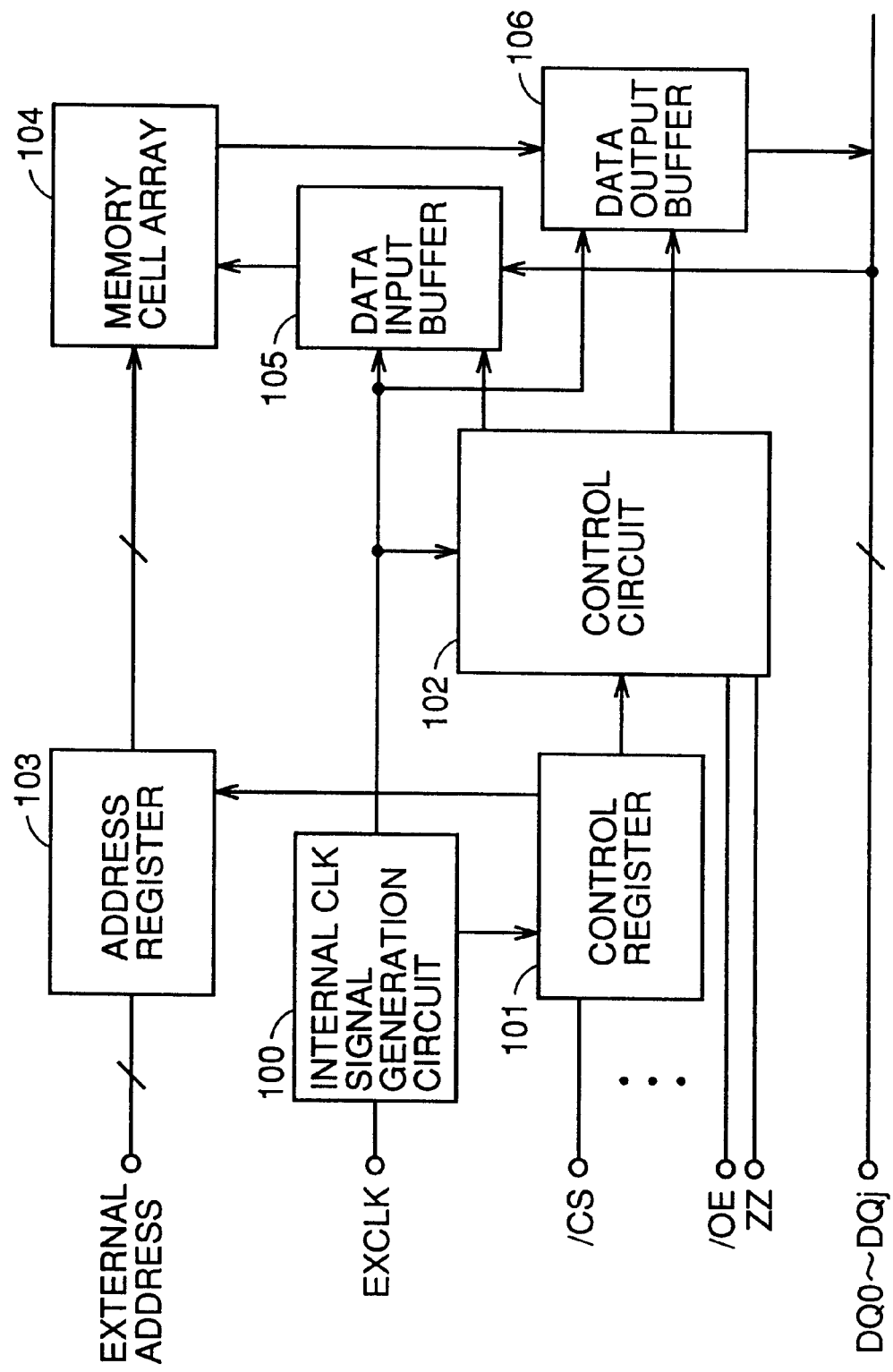
FIG. 2 is a block diagram showing an exemplary synchronous SRAM 1.

An exemplary structure of the synchronous SRAM 1 is described with reference to FIG. 2. The synchronous SRAM 1 includes an internal CLK signal generation circuit 100 receiving an external clock EXTCLK and generating an internal clock, a control register 101 capturing an external control signal (e.g., the chip selection signal /CS) in synchronization with the internal clock, a control circuit 102 capturing the value of the control register 101 in synchronization with the internal clock and asynchronously receiving an output enable signal /OE and a snooze mode signal ZZ, an address register 103 capturing an external address in response to an output from the control register 101, a memory cell array 104 including a plurality of memory cells, a data input buffer 105 capturing data received from a data bus in synchronization with the internal clock on the basis of control by the control circuit 102, and a data output buffer 106 capturing read data from the memory cell array 104 in synchronization with the internal clock on the basis of control by the control circuit 102.

A corresponding memory cell is selected with an output of the address register 103. The data of the data input buffer 105 is written in the selected memory cell. Data read from the selected memory cell is transferred to the data bus through the data output buffer 106. The data bus is connected with data input/output pins DQ0 to DQj.

Figure 3:
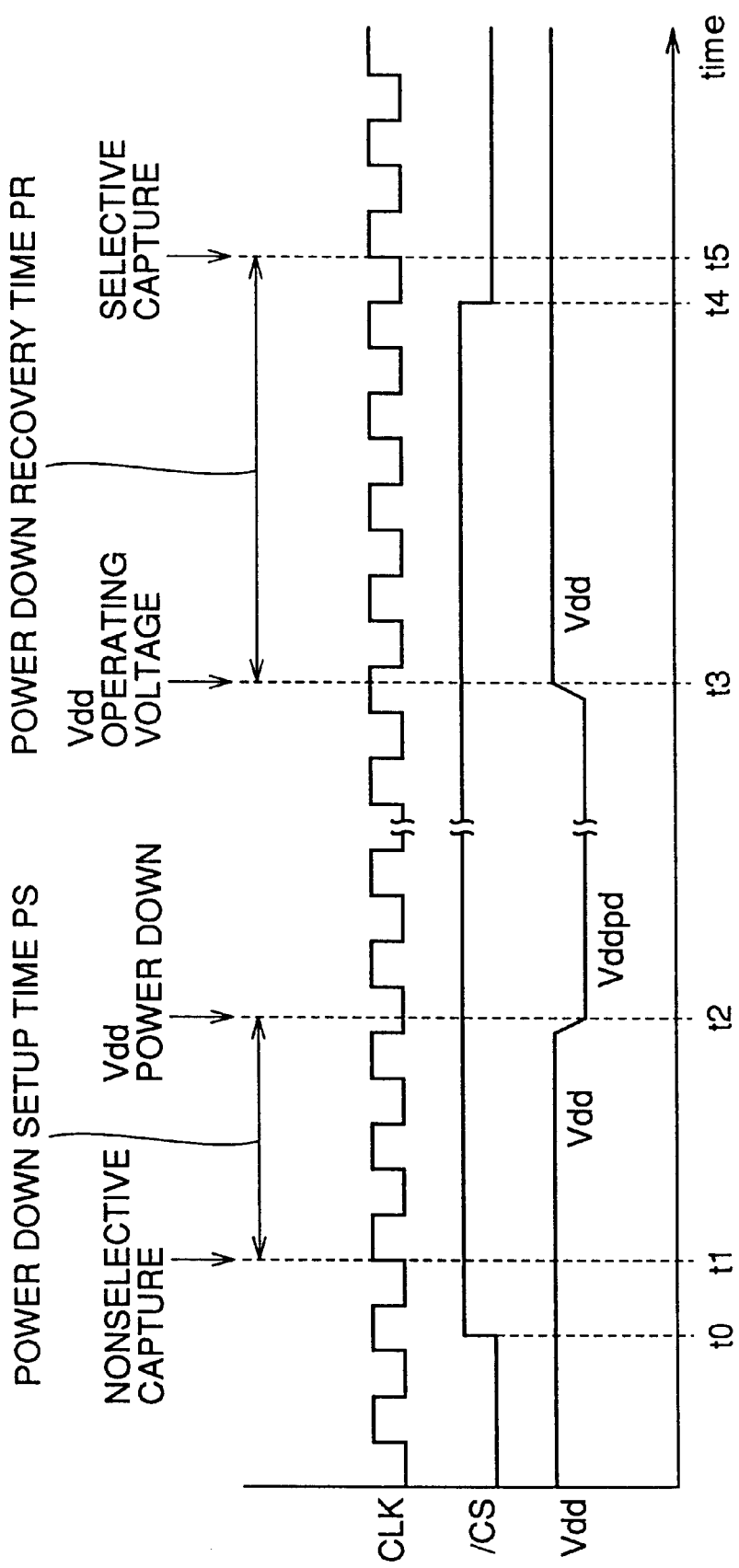
FIG. 3 is a timing chart for illustrating a power down mode/operating mode of the synchronous SRAM 1 according to the first embodiment of the present invention.

A method for setting the synchronous SRAM 1 in a power down mode/operating mode is now described with reference to FIG. 3. In order to set the synchronous SRAM 1 in the power down mode, the chip selection signal /CS is switched to a nonselective state (high) (t0). The synchronous SRAM 1 captures the nonselective chip selection signal /CS in synchronization with the clock signal CLK (t1). After a lapse of a constant cycle or a constant time (power down setup time PS) from capture of the nonselective chip selection signal /CS, the controller 5A and the voltage set circuit 4 step down the voltage of the system power supply line 3 from the general operating potential Vdd to a standby potential Vddpd (Vddpd<Vdd) (t2). The power down setup time PS, varying with design, can be set to an arbitrary cycle.

Thus, the synchronous SRAM 1 enters a standby state consuming low power. In the standby state, the control signals output from the signal generation circuit 2A remain unchanged.

In order to return the synchronous SRAM 1 from the standby state to the general operating mode, the controller 5A and the voltage set circuit 4 return the voltage of the system power supply line 3 from the standby potential Vddpd to the general operating potential Vdd (t3). The chip selection signal /CS is returned to a selective state (low) (t4). After a lapse of a constant cycle (power down recovery time PR) from return to the operating potential Vdd, the synchronous SRAM 1 captures the selective chip selection signal /CS in synchronization with the clock signal CLK (t5). The power down recovery time PR, varying with design, can be set to an arbitrary cycle.

Thus, the synchronous SRAM 1 enters an operating state and executes various operations in response to the control signals output from the signal generation circuit 2A.

Thus, according to the first embodiment of the present invention, the chip selection signal /CS is set in the nonselective state in the power down mode, to step down the power supply voltage. Thus, current consumption of the input buffer capturing a signal in response to the chip selection signal /CS can be suppressed. Therefore, power consumption can be remarkably suppressed in the standby state. Further, the synchronous SRAM 1 can be set in the operating mode by returning the power supply voltage and setting the chip selection signal /CS in the selective state.

Second Embodiment

A semiconductor integrated circuit according to a second embodiment of the present invention includes a power supply voltage sense circuit 15 sensing step-down of the voltage of a system power supply line 3. When the power supply voltage sense circuit 15 senses step-down of the voltage of the system power supply line 3, a buffer of an input initial stage included in a synchronous SRAM is inactivated. Thus, a low consumption mode is implemented.

Figure 4A:
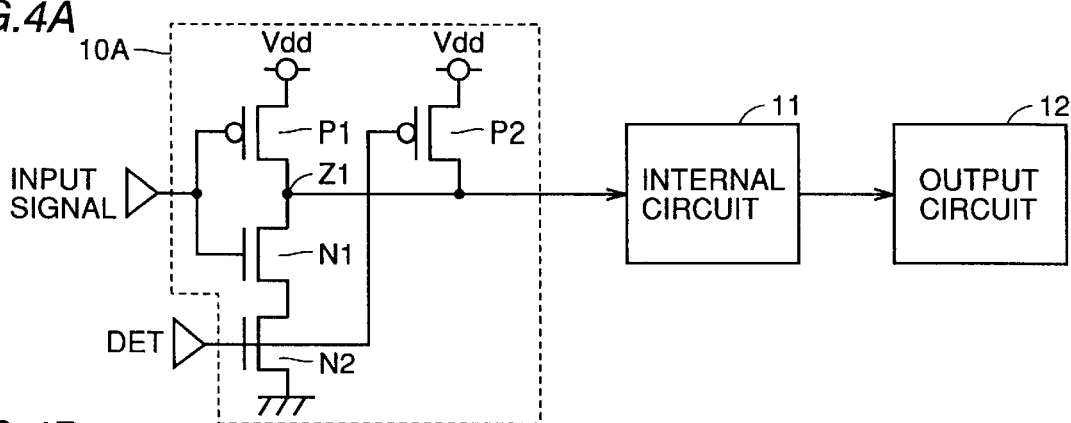
FIGS. 4A and 4B illustrate exemplary structures of an input buffer included in a synchronous SRAM according to a second embodiment of the present invention.
Figure 4B:
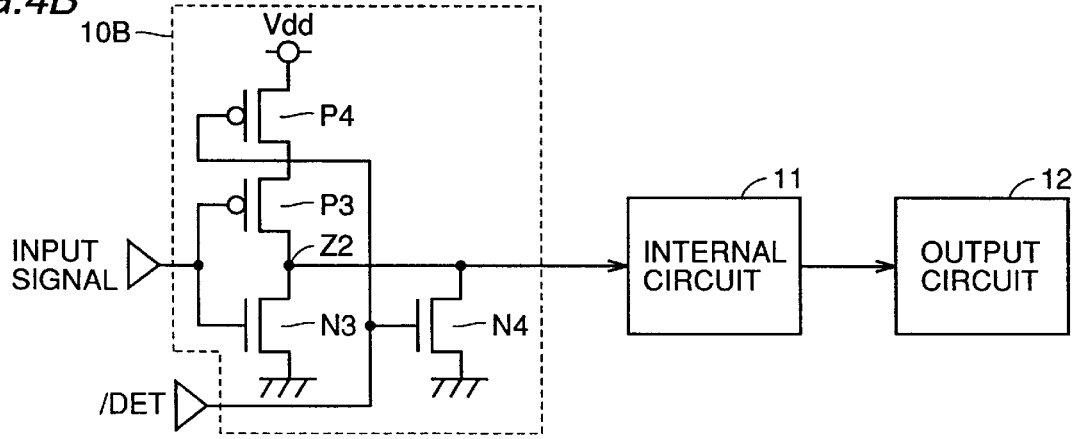

The outline of the internal structure of the synchronous SRAM according to the second embodiment of the present invention is described with reference to FIGS. 4A and 4B. FIGS. 4A and 4B show input buffers 10A and 10B capturing external signals, internal circuits 11 including memory cell arrays receiving outputs of the input buffers 10A and 10B and output circuits 12 for outputting data output from the internal circuits 11. The input buffer 10A captures an input signal in response to an internal selection signal DET. The input buffer 10B captures an input signal in response to an internal selection signal /DET obtained by inverting the internal selection signal DET. The power supply voltage sense circuit 15 outputs the internal selection signal /DET.

The input buffer 10A includes PMOS transistors P1 and P2 and NMOS transistors N1 and N2. The transistors P1, N1 and N2 are connected between a power supply node Vdd receiving an operating voltage based on the voltage of the system power supply line 3 and ground power. The gates of the transistors P1 and N2 receive the input signal to be captured. A signal on a node Z1 between the transistors P1 and N1 is transferred to the internal circuit 11. The gate of the transistor N2 receives the internal selection signal DET. The transistor P2 is connected between the node Z1 and a power supply node Vdd, and receives the internal selection signal DET in the gate thereof.

The input buffer 10B includes PMOS transistors P3 and P4 and NMOS transistors N3 and N4. The transistors P4, P3 and N3 are connected between a power supply node Vdd receiving the voltage of the system power supply line 3 and ground power. The gates of the transistors P3 and N3 receive the input signal to be captured. A signal on a node Z2 between the transistors P3 and N3 is transferred to the internal circuit 11. The gate of the transistor P4 receives the internal selection signal /DET. The transistor N4 is connected between the node Z2 and the ground power, and receives the internal selection signal /DET in the gate thereof.

The internal selection signal DET is active (high) when a power supply voltage is around the operating voltage, and inactivated (low) when the power supply voltage reaches a standby level.

The remaining structure of the synchronous SRAM is identical to that of the synchronous SRAM 1 described with reference to the first embodiment, except the aforementioned input buffer 10A or 10B.

Figure 5:
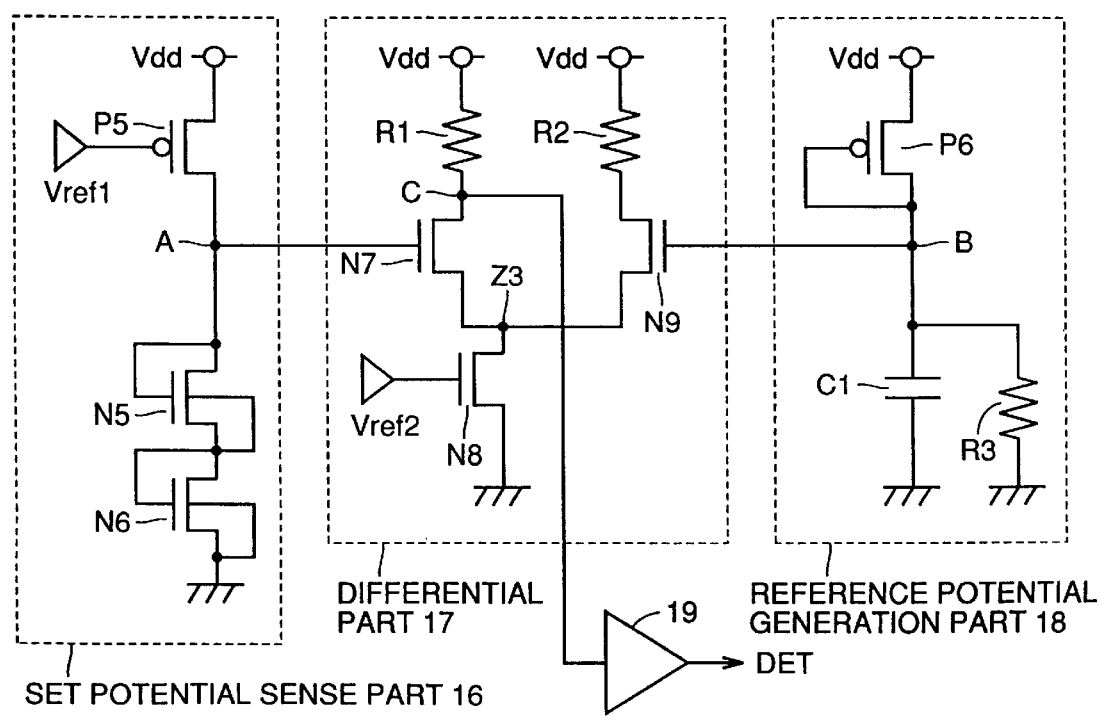
FIG. 5 is a circuit diagram showing an exemplary structure of a power supply voltage sense circuit 15 according to the second embodiment of the present invention.

An exemplary structure of the power supply voltage sense circuit 15 according to the second embodiment of the present invention is now described with reference to FIG. 5. The power supply voltage sense circuit 15 shown in FIG. 5 includes a set potential sense part 16, a differential part 17 and a reference potential generation part 18. The set potential sense part 16 includes a PMOS transistor P5 and diode-connected NMOS transistors N5 and N6. The transistor P5 is connected between power Vdd and a node A (node between a drain node of the transistor P5 and the transistor N5), and receives a reference potential Vref1 in the gate thereof. The transistors N5 and N6 are serially connected between the node A and ground power.

The differential part 17 includes resistive elements R1 and R2 and NMOS transistors N7, N8 and N9. The resistive element R1 is connected between the power Vdd and a node C. The transistor N7 is connected between the node C and a node Z3, and receives a signal on the node A of the set potential sense part 16 in the gate thereof. The transistor N8 is connected between the node Z3 and the ground power, and receives a reference potential Vref2 in the gate thereof. The resistive element R2 and the transistor N9 are connected between the power Vdd and the node Z3. The gate of the transistor N9 receives a signal on a node B of the reference potential generation part 18.

The reference potential generation part 18 includes a resistive element R3, a PMOS transistor P6 and a capacitive element C1. The transistor P6 is connected between the power Vdd and the node B, with the gate connected to a drain node (the node B). The capacitive element C1 and the resistive element R3 are connected between the node B and the ground power.

When the potential Vdd is stepped down to a value obtained by summing up the total of the thresholds of the NMOS transistors N5 and N6 of the set potential sense part 16 and the threshold of the PMOS transistor P6 of the set potential generation part 18, the potential of the sense node C of the differential part 17 is inverted and a low-level signal is output due to the aforementioned structure. A buffer 19 receives the signal of the node C and outputs the internal selection signal DET.

A voltage set circuit 4 and a controller 5A for setting the system power Vdd are identical to those described with reference to the first embodiment.

Figure 6:
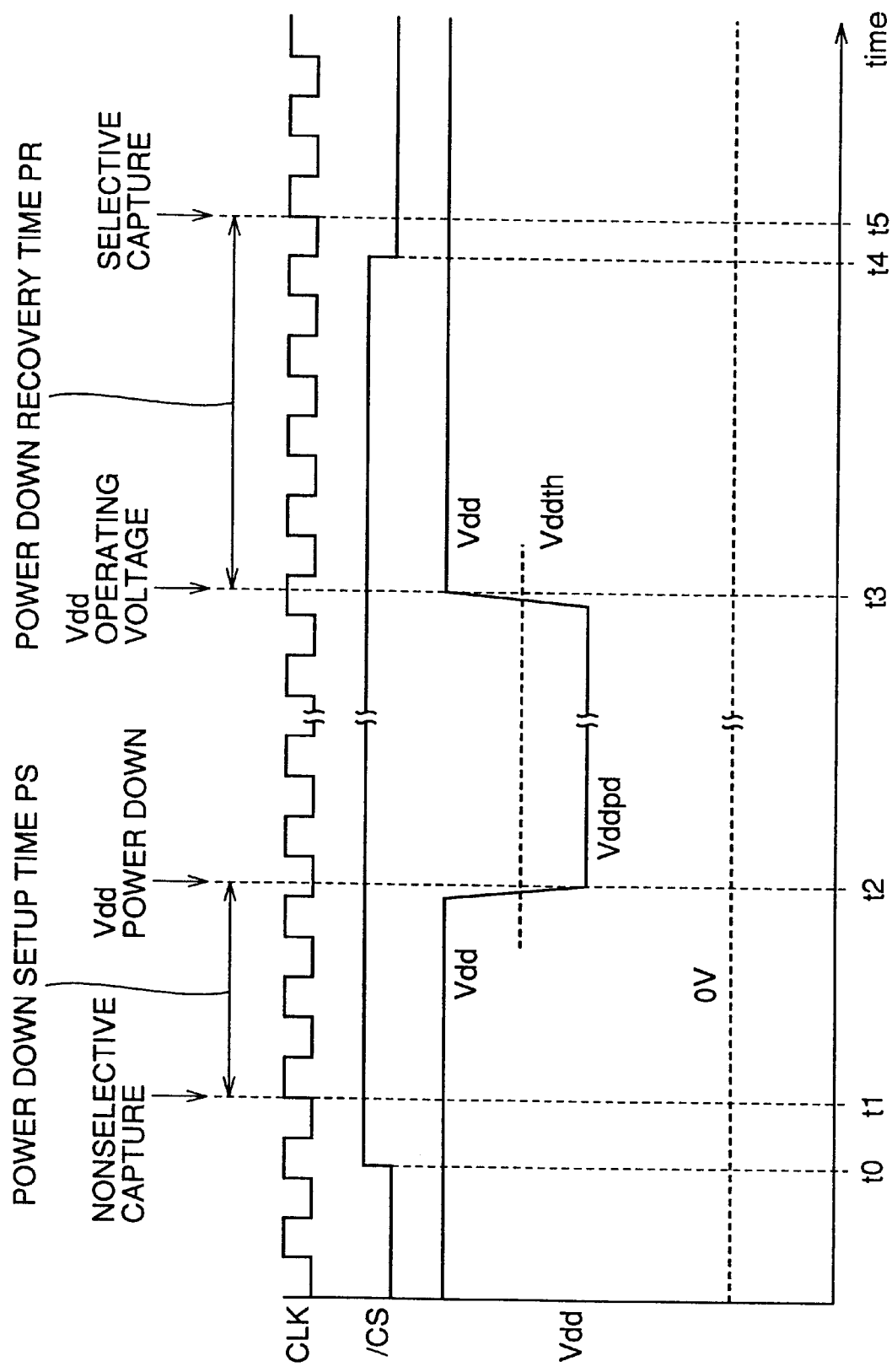
FIG. 6 is a timing chart for illustrating a power down mode/operating mode of the synchronous SRAM according to the second embodiment of the present invention.

A method for setting the synchronous SRAM in a power down mode/operating mode is described with reference to FIG. 6. In order to set the synchronous SRAM in the power down mode, a chip selection signal /CS is set in a nonselective state (t0), similarly to the first embodiment. After a lapse (t2) of a power down setup time PS after the synchronous SRAM captures the nonselective chip selection signal /CS (t1), the voltage of the system power supply line 3 is stepped down to a standby potential Vddpd. The synchronous SRAM 1 enters a standby state.

At this time, the power supply voltage sense circuit 15 senses the step-down of the voltage of the system power supply line 3. When the voltage of the system power supply line 3 falls below a set sense level Vddth (Vddpd<Vddth<Vdd), the input buffer 10A or 10B included in the synchronous SRAM is inactivated.

In order to return the synchronous SRAM from the standby state to the operating mode, the voltage of the system power supply line 3 is returned from the standby potential Vddpd to the operating potential Vdd (t3). The chip selection signal /CS is set in a selective state (t4). After a lapse of a chip power down recovery time PR from the rise to the operating potential Vdd, the synchronous SRAM captures the selective chip selection signal /CS. Thus, the synchronous SRAM enters an operating state from the standby state.

According to the second embodiment of the present invention, as hereinabove described, the input buffer can be inactivated by sensing step-down of the power supply voltage when executing the power down mode. Thus, power consumption can be further reduced.

Third Embodiment

Figure 7:
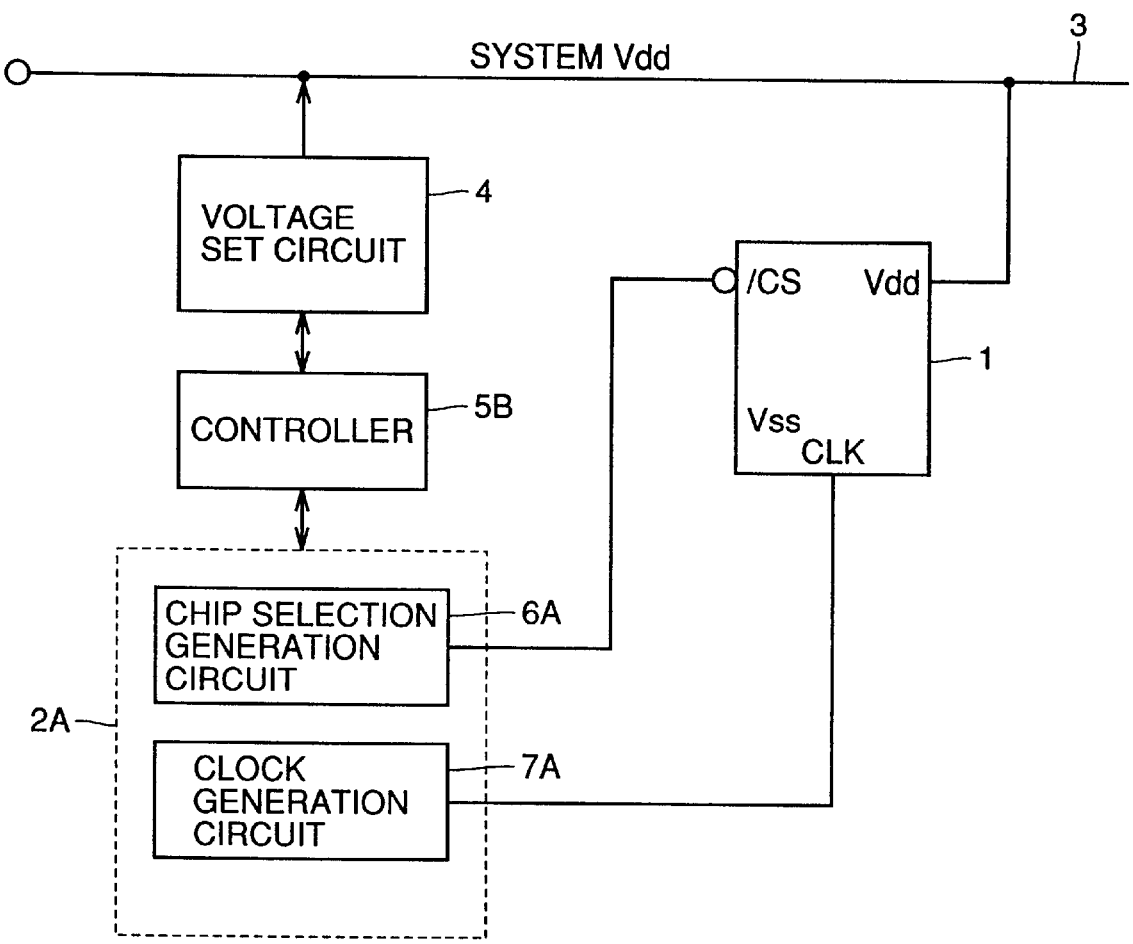
FIG. 7 illustrates the outline of the structure of a semiconductor integrated circuit according to a third embodiment of the present invention.

A semiconductor integrated circuit according to a third embodiment of the present invention is described with reference to FIG. 7. The semiconductor integrated circuit shown in FIG. 7 includes a synchronous SRAM 1, a signal generation circuit 2A for supplying control signals to the synchronous SRAM 1, a system power supply line 3, a voltage set circuit 4 setting the voltage (system power supply voltage Vdd) of the system power supply line 3, and a controller 5B controlling voltage setting in the voltage set circuit 4 and signal generation in the signal generation circuit 2A. The controller 5B fixes a clock signal CLK to a prescribed level when setting the synchronous SRAM 1 in a power down mode.

Figure 8:
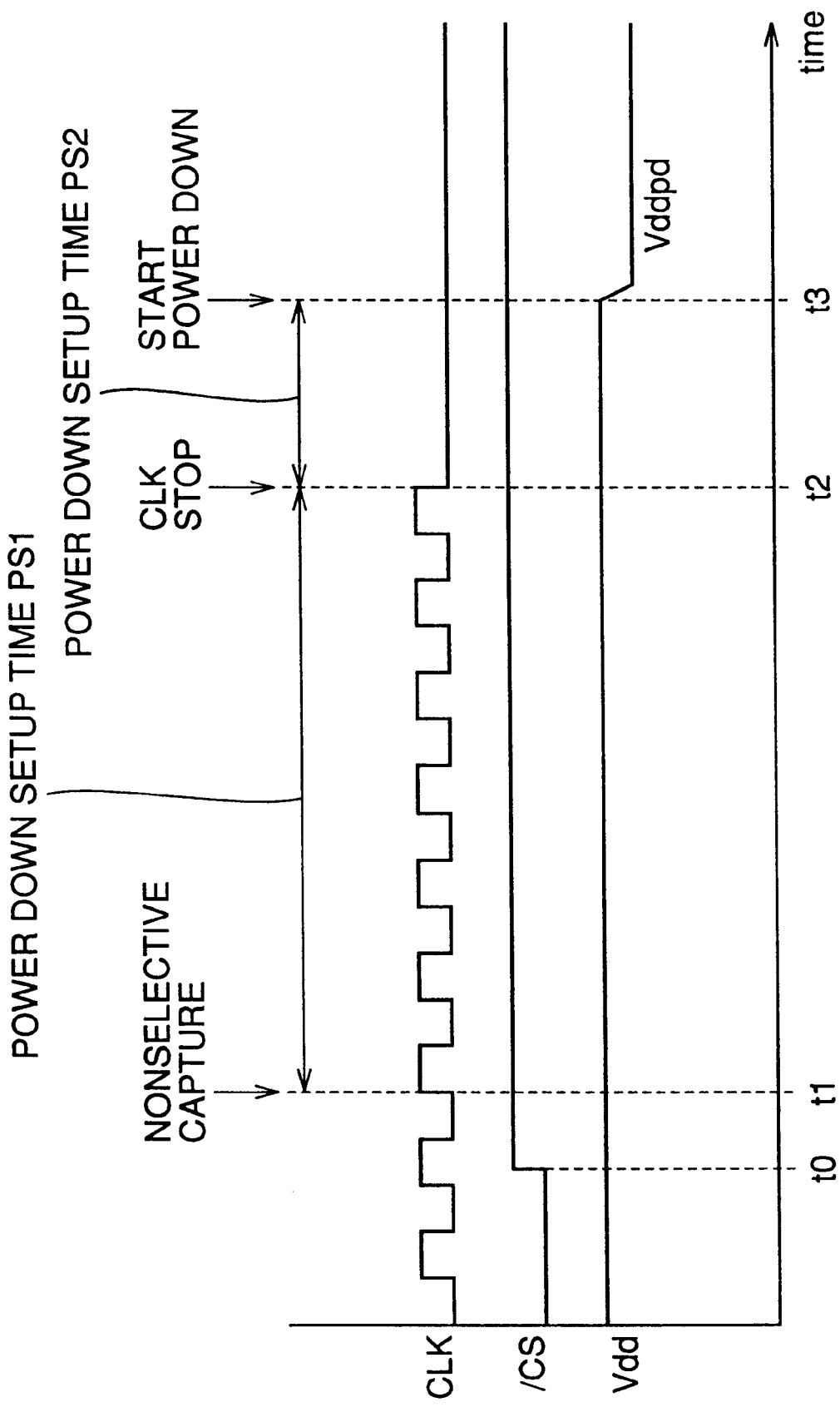
FIGS. 8 and 9 are timing charts for illustrating a power down mode/operating mode of a synchronous SRAM according to the third embodiment of the present invention.

A method for setting the synchronous SRAM 1 in the power down mode/operating mode is described with reference to FIGS. 8 and 9. Referring to FIG. 8, a chip selection signal /CS is first switched to a nonselective state (high) (t0), in order to set the synchronous SRAM 1 in the power down mode. The synchronous SRAM 1 captures the nonselective chip selection signal /CS in synchronization with the clock signal CLK (t1). After a lapse of a constant cycle (power down setup time PS 1) after the synchronous SRAM 1 captures the nonselective chip selection signal /CS, a clock stop operation is performed on the basis of control by the controller 5B. More specifically, the clock signal CLK is fixed low (t2).

After a lapse of a constant cycle (power down setup time PS2) from the clock stop operation, the controller 5B and the voltage set circuit 4 step down the voltage of the system power supply line 3 from a general operating potential Vdd to a standby potential Vddpd (Vddpd<Vdd) (t3). The power down setup times PS1 and PS2, varying with design, can be set to arbitrary cycles. Thus, the synchronous SRAM 1 enters a standby state.

Figure 9:
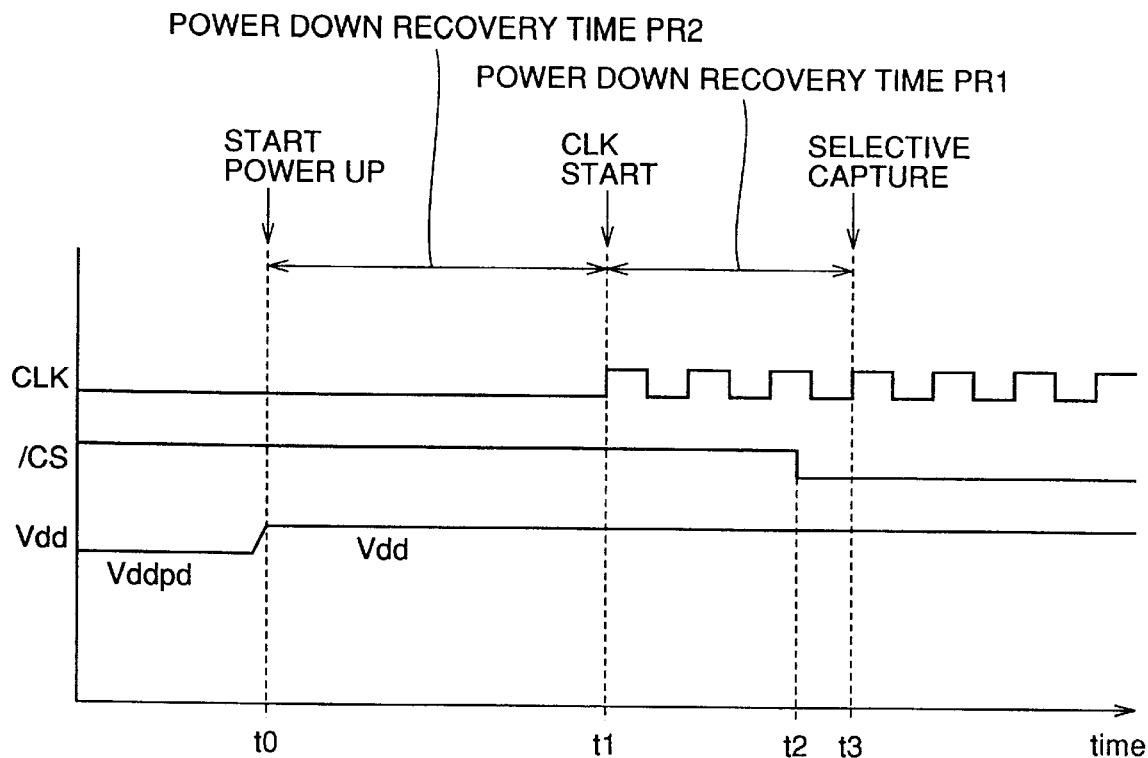

Referring to FIG. 9, the voltage of the system power supply line 3 is returned from the standby potential Vddpd to the general operating potential Vdd (t0), in order to exit from the power down mode. A clock start operation is performed after a lapse of a constant cycle (power down recovery time PR2). In other words, the clock signal CLK is generated (t1). The chip selection signal /CS is returned to a selective state (t2). After a lapse of a constant cycle (power down recovery time PR1) from the clock start operation, the synchronous SRAM 1 captures the selective chip selection signal /CS in synchronization with the clock signal CLK (t3).

The power down recovery times PRI and PR2, varying with design, can be set to arbitrary cycles. Thus, the synchronous SRAM 1 returns from the standby state to an operating state.

A clock buffer capturing the clock signal CLK can be inactivated by performing the clock stop operation in the standby state. Thus, power consumption can be further reduced in the standby state.

Figure 10:
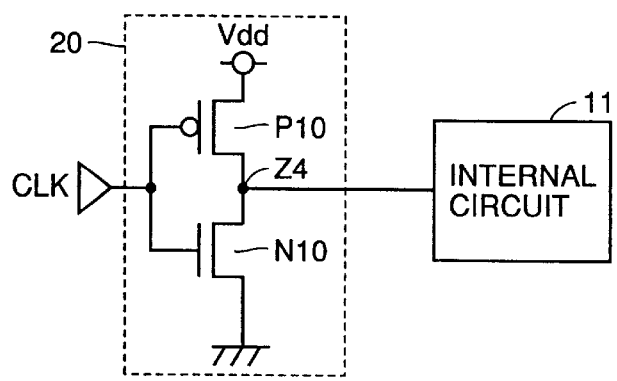
FIG. 10 is a circuit diagram showing an exemplary input circuit included in the synchronous SRAM according to the third embodiment of the present invention.

An input circuit 20 capturing the clock signal CLK included in the synchronous SRAM 1 according to the third embodiment of the present invention is now described with reference to FIG. 10. The input circuit 20 shown in FIG. 10 includes an NMOS transistor N10 and a PMOS transistor P10. The transistors P10 and N10 are connected between a power supply node Vdd receiving an operating voltage based on the voltage of the system power supply line 3 and ground power. The gates of the transistors P10 and N10 receive the clock signal CLK. A signal on a node Z4 between the transistors P10 and N10 is transferred to an internal circuit 11.

In a conventional input circuit capturing the clock signal CLK, a transistor having a gate receiving a specific control signal is inserted in a current path (between the transistor N10 and ground power). This transistor is turned off with the specific control signal, thereby preventing generation of alternating current following fluctuation of the clock signal CLK.

According to the third embodiment of the present invention, however, the clock signal CLK is fixed low in the standby state. Therefore, no such transistor for preventing alternating current is required but the input circuit 20 shown in FIG. 10 can be employed.

Fourth Embodiment

A semiconductor integrated circuit according to a fourth embodiment of the present invention is described. The semiconductor integrated circuit according to the fourth embodiment of the present invention is identical in basic structure to that according to the third embodiment. In the fourth embodiment, a clock stop operation and setting of system power Vdd are performed at timings different from those in the third embodiment.

Figure 11:
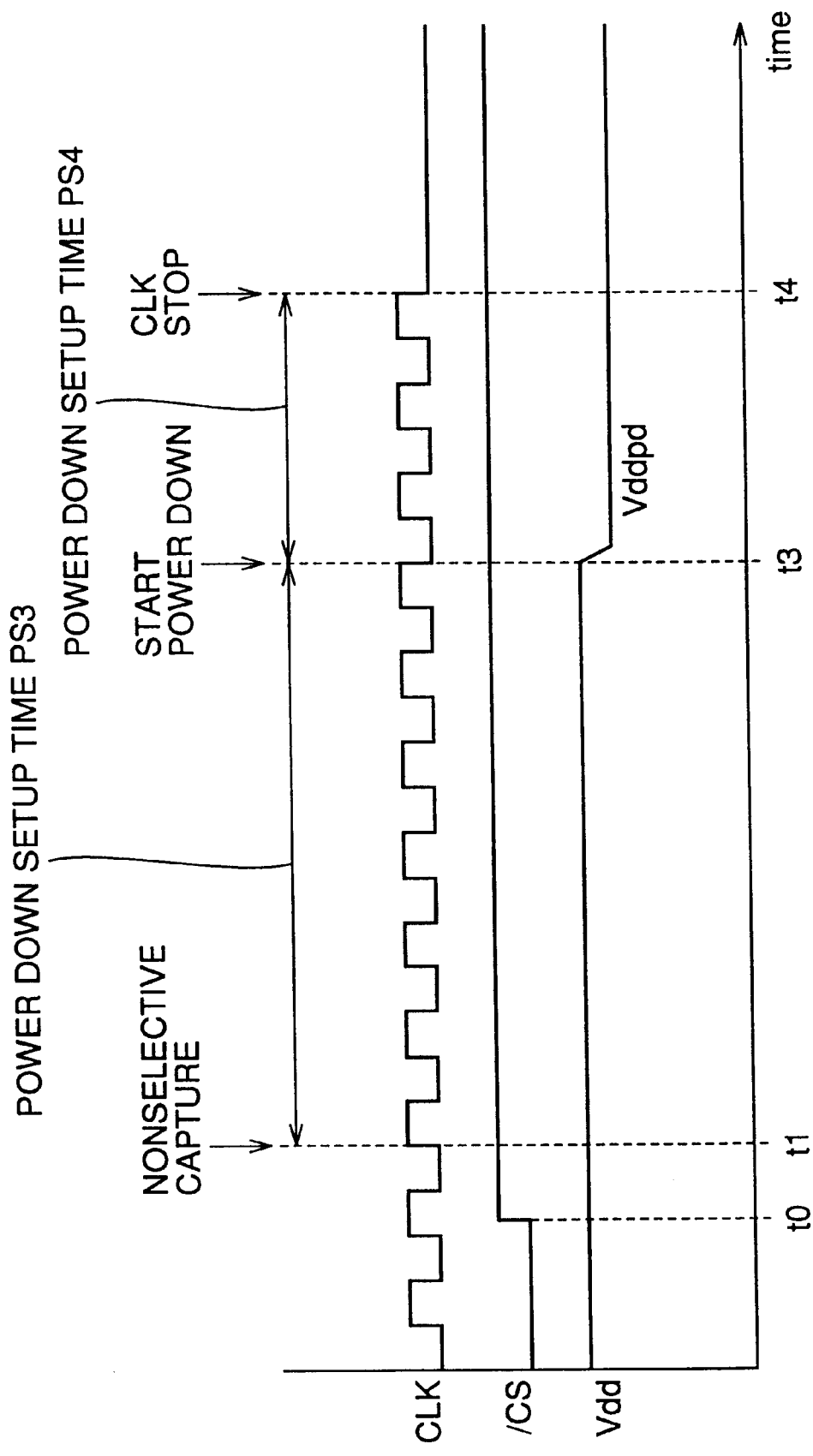
FIGS. 11 and 12 are timing charts for illustrating a power down mode/operating mode of a synchronous SRAM according to a fourth embodiment of the present invention.

A method for setting a synchronous SRAM 1 in a power down mode/operating mode is described with reference to FIGS. 11 and 12. Referring to FIG. 11, a chip selection signal /CS is first switched to a nonselective state (high) (t0), in order to set the synchronous SRAM 1 in the power down mode. The synchronous SRAM 1 captures the nonselective chip selection signal /CS in synchronization with a clock signal CLK (t1). A controller 5B and a voltage set circuit 4 step down the voltage of a system power supply line 3 from a general operating potential Vdd to a standby potential Vddpd (Vddpd<Vdd) (t3) after a lapse of a constant cycle (power down setup time PS3) after the synchronous SRAM 1 captures the nonselective chip selection signal /CS.

After a lapse of a constant cycle (power down setup time PS4) from the voltage drop, a clock stop operation is performed under control of the controller 5B, for fixing the clock signal CLK low (t4). Thus, the synchronous SRAM 1 enters a standby state having extremely low power consumption.

Figure 12:
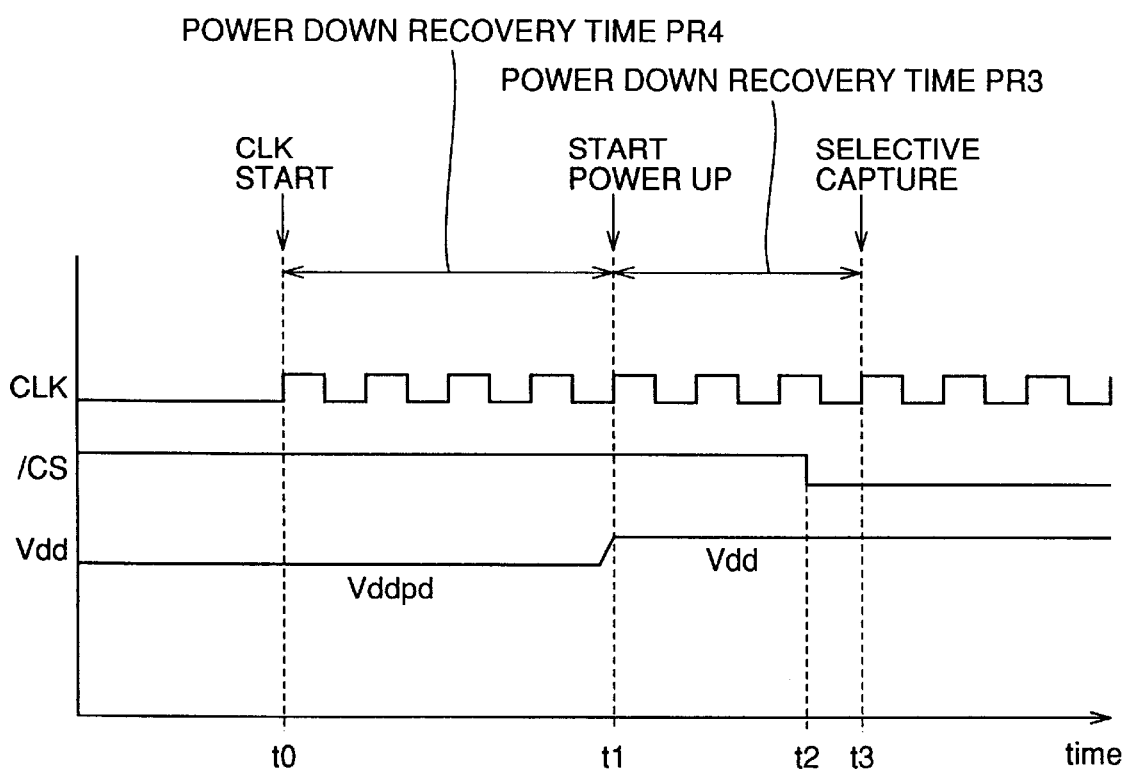

Referring to FIG. 12, a clock start operation is performed under control of the controller 5B and the clock signal CLK is generated in order to exit from the power down mode (t0). After a lapse of a constant cycle (power down recovery time PR4) from the clock start operation, the controller 5B and the voltage set circuit 4 return the voltage of the system power supply line 3 from the standby potential Vddpd to the general operating potential Vdd (t1).

Further, the chip selection signal /CS is returned to a selective state (t2). After a lapse of a constant cycle (power down recovery time PR3) from return of the voltage, the synchronous SRAM 1 captures the selective chip selection signal /CS (t3).

Current consumption of an input circuit capturing the clock signal CLK can be suppressed by performing the clock stop operation in the aforementioned manner. Further, the input circuit 20 described with reference to the third embodiment can be employed as the circuit capturing the clock signal CLK.

Fifth Embodiment

Figure 13:
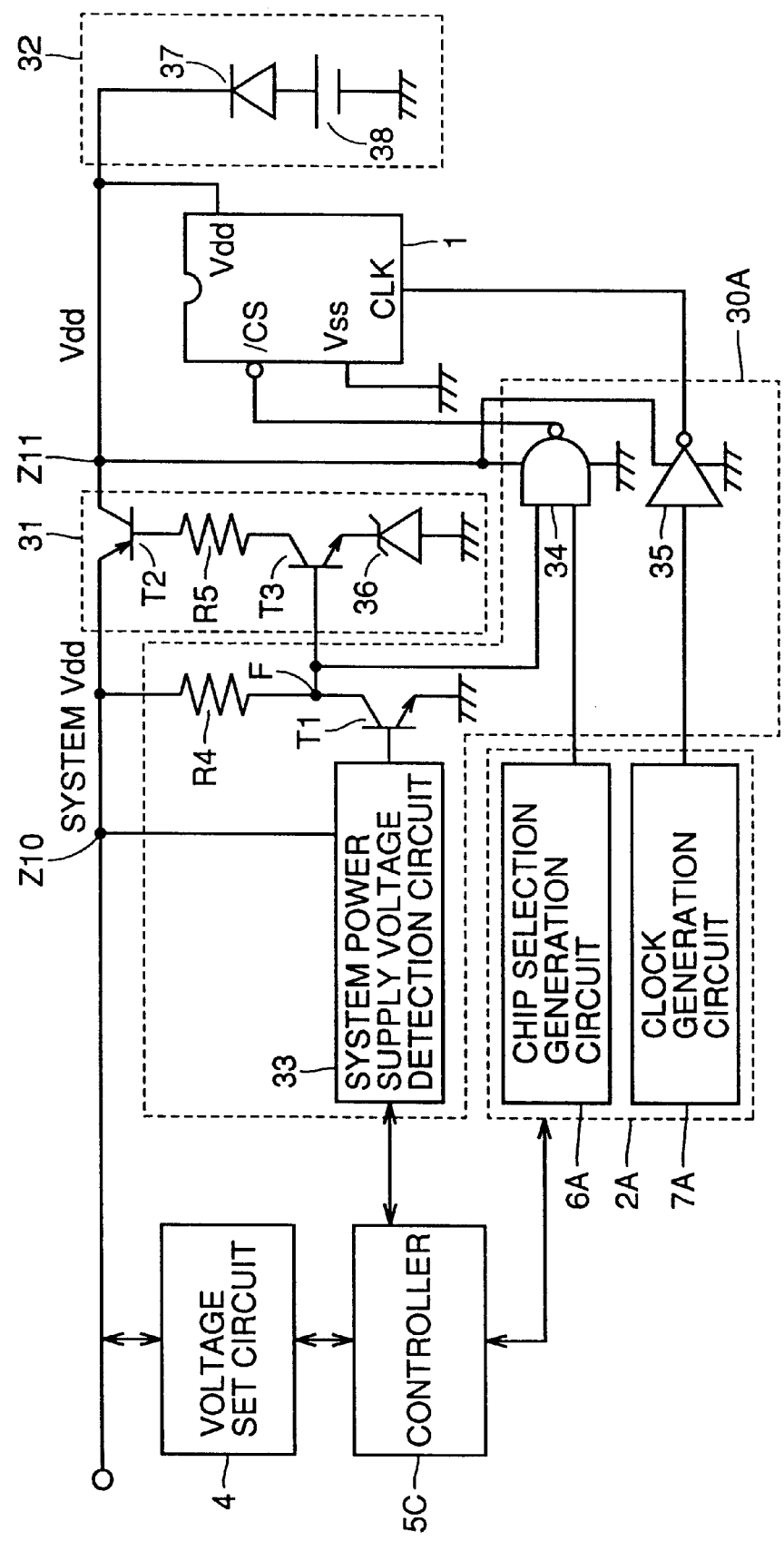
FIG. 13 illustrates a semiconductor integrated circuit system according to a fifth embodiment of the present invention.

A semiconductor integrated circuit system according to a fifth embodiment of the present invention is described with reference to FIG. 13. The semiconductor integrated circuit system shown in FIG. 13 includes a synchronous SRAM 1, a signal generation circuit 2A, a voltage set circuit 4, a controller 5C, a controller 30A, a stabilizing circuit 31 and a backup circuit 32. Each of the semiconductor integrated circuit system according to the fifth embodiment of the present invention and those according to sixth to tenth embodiments of the present invention is employable as a battery backup system for a portable telephone or the like. The controller 5C controls signal generation in the signal generation circuit 2A and voltage setting in the voltage set circuit 4.

The controller 30A includes a system power supply voltage detection circuit 33, a resistive element R4, a bipolar transistor T1, a NAND circuit 34 and an inverter 35. The system power supply voltage detection circuit 33 detects the level of the voltage (system power Vdd) on a node Z10 of a system power supply line. The resistive element R4 is connected between the node Z10 and a node F. The transistor T1 is connected between the node F and ground power, and receives a result of detection in the system power supply voltage detection circuit 33 in the base thereof.

The NAND circuit 34 receives a signal from the node F and an output of a chip selection generation circuit 6A, and outputs a chip selection signal /CS. The inverter 35 receives an output from a clock generation circuit 7A and outputs a clock signal CLK.

The NAND circuit 34 and the inverter 35 receive the voltage Vdd of a node Z11 connected with a power supply pin Vdd of the synchronous SRAM 1 to operate.

The controller 30A supplies the chip selection signal /CS and the clock signal CLK to the synchronous SRAM 1. When the system power Vdd is abruptly stepped down, the system power supply voltage detection circuit 33 sets an output of the NAND circuit 34 high. In other words, the system power supply voltage detection circuit 33 sets the chip selection signal /CS in a nonselective state (high).

The stabilizing circuit 31 includes bipolar transistors T2 and T3, a resistive element R5 and a zener diode 36. The transistor T2 is connected between the node Z11 and the node Z11. The resistive element R5 is connected between the base of the transistor T2 and the collector of the transistor T3. The base of the transistor T3 is connected to the output node F of the controller 30A. The zener diode 36 is connected between the emitter of the transistor T3 and the ground power.

When the voltage Vdd of the node Z11 exceeds a standard value, current is extracted through the zener diode 36 for preventing the synchronous SRAM 1 from supply of an excess voltage.

The backup circuit 32 includes a diode 37 and a circuit 38. The diode 37 and the circuit 38 are connected between the node Z11 and the ground power. The circuit 38 is formed by a battery of about 2 to 3 V, for example. Following stepdown of the voltage Vdd, the diode 37 is forwardly turned on so that the backup circuit 32 supplies power to the synchronous SRAM.

The controller 5C performs control for setting the synchronous SRAM 1 in a power down mode/operating mode. In the power down mode, the voltage set circuit 4 steps down the power supply voltage Vdd beyond an operating potential on the basis of control by the controller 5C. Further, the logical level of the chip selection signal /CS is switched on the basis of control by the controller 5C.

Thus, the chip selection signal /CS is switched to a nonselective state for executing the power down mode due to the aforementioned structure. Consequently, power consumption in the synchronous SRAM 1 is reduced. The power for the synchronous SRAM 1 is ensured with the backup circuit 32. Thus, recorded data of the synchronous SRAM 1 is protected.

Sixth Embodiment

Figure 14:
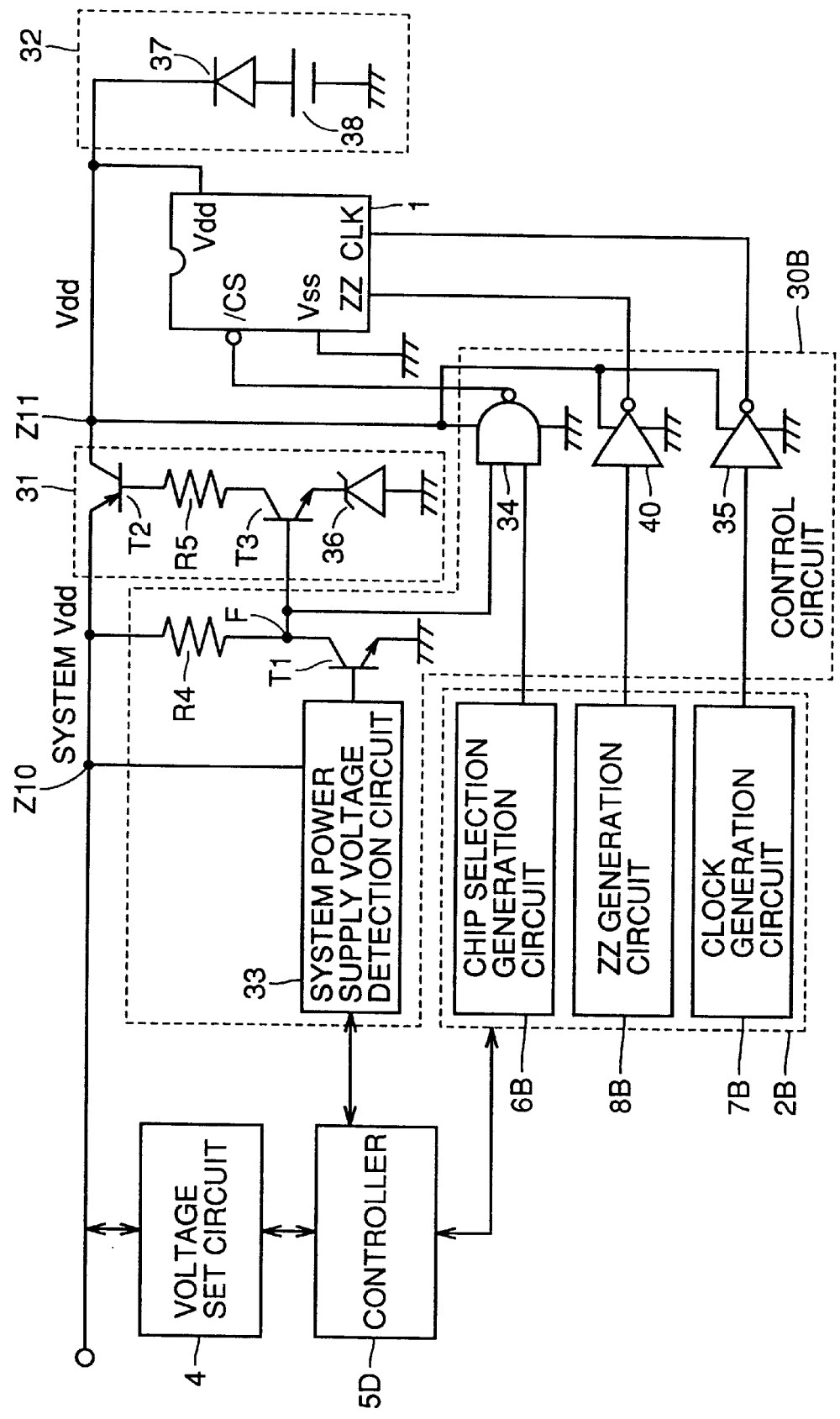
FIG. 14 illustrates a semiconductor integrated circuit system according to a sixth embodiment of the present invention.

The semiconductor integrated circuit system according to the sixth embodiment of the present invention is described with reference to FIG. 14. The semiconductor integrated circuit system shown in FIG. 14 comprises a synchronous SRAM 1, a signal generation circuit 2B, a voltage set circuit 4, a controller 5D, a controller 30B, a stabilizing circuit 31 and a backup circuit 32. The controller 5D controls signal generation in the signal generation circuit 2B and voltage setting in the voltage set circuit 4.

The signal generation circuit 2B generates control signals controlling operations of the synchronous SRAM 1. FIG. 14 representatively illustrates a chip selection generation circuit 6B generating a chip selection signal /CS, a clock generation circuit 7B generating a dock signal CLK and a ZZ generation circuit 8B generating a snooze mode signal ZZ setting the synchronous SRAM 1 in a snooze mode as components of the signal generation circuit 2B.

The controller 30B includes a system power supply voltage detection circuit 33, a resistive element R4, a transistor T1, a NAND circuit 34 and inverters 35 and 40. The system power supply voltage detection circuit 33, the resistive element R4, the transistor T1, the NAND circuit 34 and the inverter 35 are identical to those described with reference to the fifth embodiment. The inverter 40 receives an output of the ZZ generation circuit 8B and outputs the snooze mode signal ZZ to the synchronous SRAM 1. The NAND circuit 34 and the inverters 35 and 40 receive a voltage Vdd of a node Z11 to operate.

The controller 30B supplies the chip selection signal /CS and the clock signal CLK to the synchronous SRAM 1.

When the system power Vdd is abruptly stepped down, the chip selection signal /CS output from the NAND circuit 34 is set in a nonselective state (high) on the basis of a result of detection by the system power supply voltage detection circuit 33. The controller 30B asynchronously controls the synchronous SRAM 1 through the inverter 40 serving as a buffer for the snooze mode signal ZZ.

The controller 5D performs control for setting the synchronous SRAM 1 in a power down mode/operating mode. In the power down mode, the voltage set circuit 4 steps down the power supply voltage Vdd beyond an operating potential on the basis of control by the controller 5D. Further, the logical levels of the chip selection signal /CS and the snooze mode signal ZZ are switched on the basis of control by the controller 5D.

The chip selection signal /CS is switched to a nonselective state and the snooze mode signal ZZ is set high (snooze mode execution) for executing the power down mode due to the aforementioned structure. Thus, power consumption in the synchronous SRAM 1 is reduced. At this time, power for the synchronous SRAM 1 is ensured with the backup circuit 32. Thus, stored data is protected.

Seventh Embodiment

Figure 15:
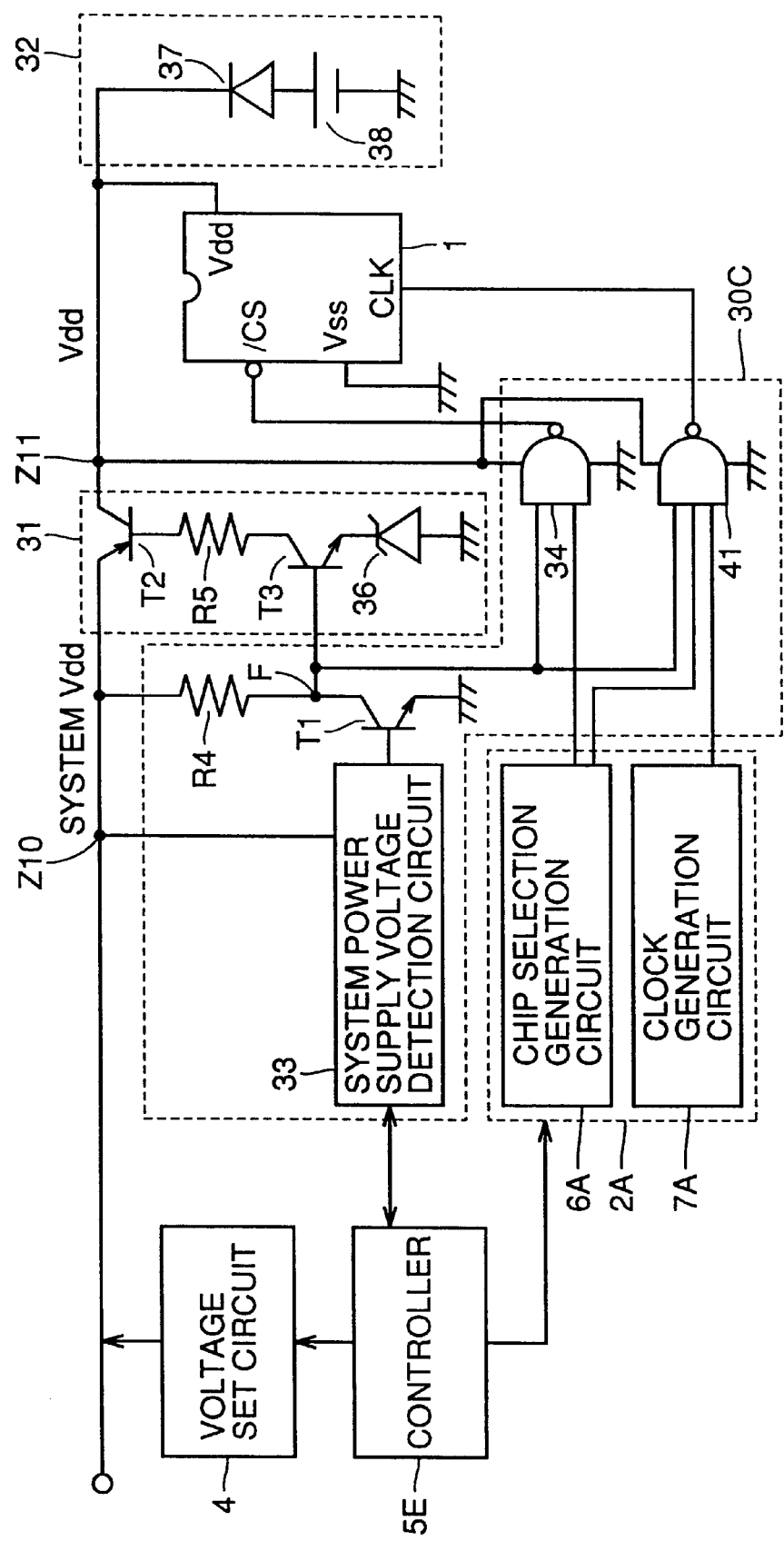
FIG. 15 illustrates a semiconductor integrated circuit system according to a seventh embodiment of the present invention.

The semiconductor integrated circuit system according to the seventh embodiment of the present invention is described with reference to FIG. 15. The semiconductor integrated circuit system shown in FIG. 15 comprises a synchronous SRAM 1, a signal generation circuit 2A, a voltage set circuit 4, a controller 5E, a controller 30C, a stabilizing circuit 31 and a backup circuit 32. The controller 5E controls voltage setting in the voltage set circuit 4 and signal generation in the signal generation circuit 2A.

The controller 30C includes a system power supply voltage detection circuit 33, a resistive element R4, a transistor T1 and NAND circuits 34 and 41. The system power supply voltage detection circuit 33, the resistive element R4, the transistor T1 and the NAND circuit 34 are identical to those described with reference to the fifth embodiment. The NAND circuit 41 receives a signal of a node F, an output of a clock generation circuit 7A and an output of a chip selection generation circuit 6A and outputs a clock signal CLK. In other words, the NAND circuit 41 serving as a clock buffer is controlled by the node F through resistive bias from the chip selection generation circuit 6A and system power Vdd. The NAND circuits 34 and 41 are supplied with the voltage Vdd of a node Z11.

The controller 30C supplies a chip selection signal /CS and the clock signal CLK to the synchronous SRAM 1. When the system power Vdd is abruptly stepped down, the chip selection signal /CS output from the NAND circuit 34 is set in a nonselective state (high) on the basis of a result of detection by the system power supply voltage detection circuit 33. Further, the output of the NAND circuit 41 is fixed high on the basis of the result of detection by the system power supply voltage detection circuit 33. In other words, a dock stop operation is performed.

The controller 5E performs control for setting the synchronous SRAM 1 in a power down mode/operating mode. In the power down mode, the voltage set circuit 4 steps down the power supply voltage Vdd beyond an operating potential on the basis of control by the controller 5E. Further, the logical level of the chip selection signal /CS is switched on the basis of control by the controller 5E, for performing the clock stop operation.

The chip selection signal /CS is switched to the nonselective state when executing the power down mode due to the aforementioned structure, for performing the clock stop operation. Thus, power consumption in the synchronous SRAM 1 is reduced. Power for the synchronous SRAM 1 is ensured with the backup circuit 32. Thus, stored data is protected.

Eighth Embodiment

Figure 16:
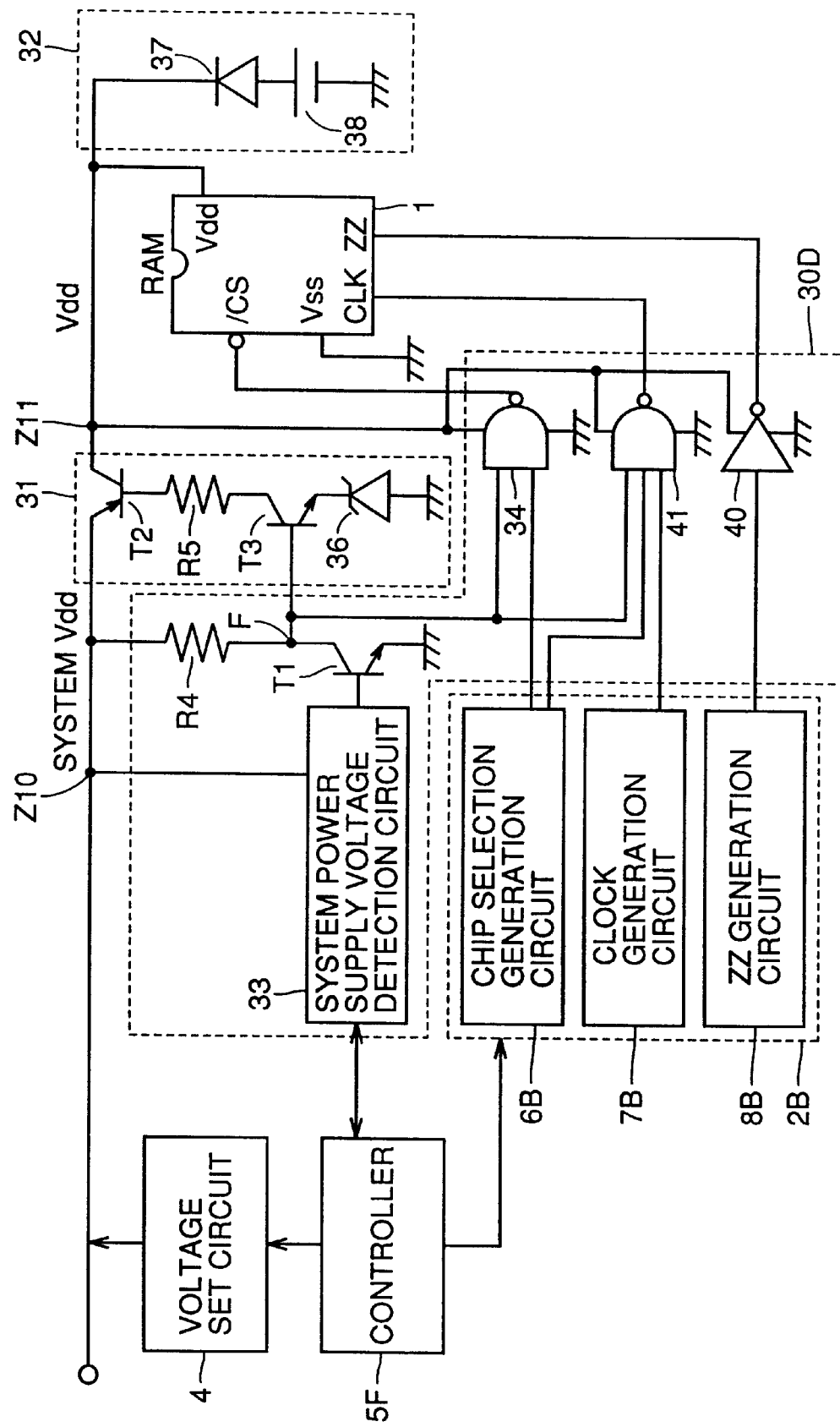
FIG. 16 illustrates a semiconductor integrated circuit system according to an eighth embodiment of the present invention.

The semiconductor integrated circuit system according to the eighth embodiment of the present invention is described with reference to FIG. 16. The semiconductor integrated circuit system shown in FIG. 16 comprises a synchronous SRAM 1, a signal generation circuit 2B, a voltage set circuit 4, a controller 5F, a controller 30D, a stabilizing circuit 31 and a backup circuit 32. The controller 5F controls voltage setting in the voltage set circuit 4 and signal generation in the signal generation circuit 2B. The controller 30D includes a system power supply voltage detection circuit 33, a resistive element R4, a transistor T1, NAND circuits 34 and 41 and an inverter 40. The NAND circuit 34 outputs a chip selection signal /CS, the NAND circuit 41 outputs a clock signal CLK and the inverter 40 outputs a snooze mode signal ZZ. The NAND circuit 41 serving as a clock buffer is controlled by a node F through resistive bias from a chip selection generation circuit 6B and system power Vdd. The NAND circuits 34 and 41 and the inverter 40 are supplied with the voltage Vdd of a node Z11 to operate.

The controller 30D supplies the chip selection signal /CS and the clock signal CLK to the synchronous SRAM 1. When the system power Vdd is abruptly stepped down, the chip selection signal /CS output from the NAND circuit 34 is set in a nonselective state (high) on the basis of a result of detection by the system power supply voltage detection circuit 33. Further, the output of the NAND circuit 41 is fixed on the basis of the result of detection by the system power supply voltage detection circuit 33. In other words, a clock stop operation is performed. The controller 30D asynchronously controls the synchronous SRAM 1 through the inverter 40 serving as a buffer for the snooze mode signal ZZ.

The controller 5F performs control for setting the synchronous SRAM 1 in a power down mode/operating mode. In the power down mode, the voltage set circuit 4 steps down the power supply voltage Vdd beyond an operating potential on the basis of control by the controller 5F. Further, the logical levels of the chip selection signal /CS and the snooze mode signal ZZ are switched on the basis of control by the controller 5E, for performing the clock stop operation.

The chip selection signal /CS is switched to the nonselective state when executing the power down mode due to the aforementioned structure, for performing the clock stop operation. Further, the snooze mode signal ZZ is switched high (snooze mode execution). Thus, power consumption in the synchronous SRAM 1 is reduced. Power for the synchronous SRAM 1 is ensured with the backup circuit 32. Thus, stored data is protected.

Ninth Embodiment

Figure 17:
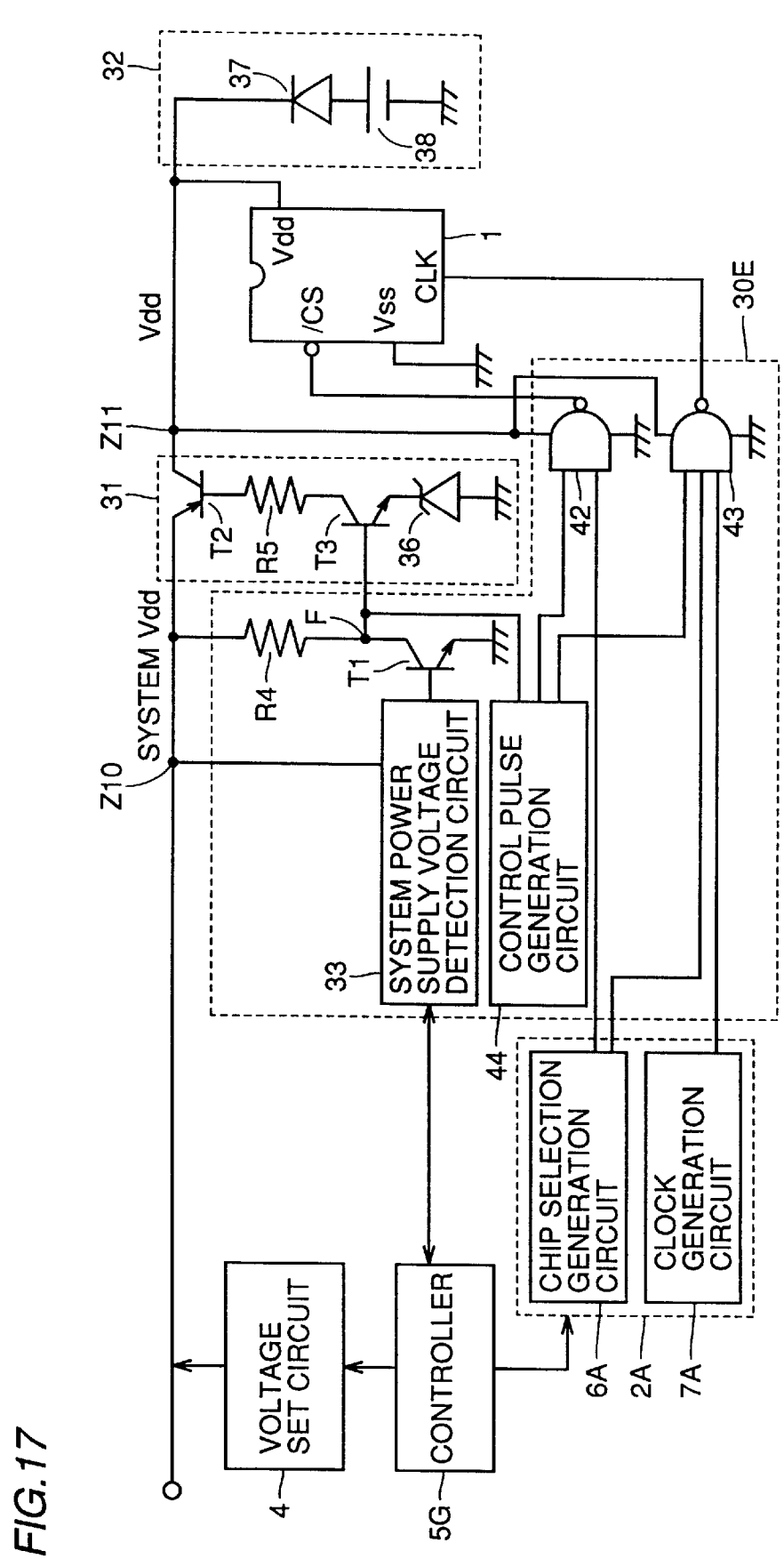
FIG. 17 illustrates a semiconductor integrated circuit system according to a ninth embodiment of the present invention.

The semiconductor integrated circuit system according to the ninth embodiment of the present invention is described with reference to FIG. 17. The semiconductor integrated circuit system shown in FIG. 17 comprises a synchronous SRAM 1, a signal generation circuit 2A, a voltage set circuit 4, a controller 5G, a controller 30E, a stabilizing circuit 31 and a backup circuit 32. The controller 5G controls voltage setting in the voltage set circuit 4 and signal generation in the signal generation circuit 2A.

The controller 30E includes a system power supply voltage detection circuit 33, a resistive element R4, a transistor T1, NAND circuits 42 and 43 and a control pulse generation circuit 44. The NAND circuit 42 receives outputs of the control pulse generation circuit 44 and a chip selection generation circuit 6A and outputs a chip selection signal /CS. The NAND circuit 43 serving as a clock buffer receives outputs from the control pulse generation circuit 44, a clock generation circuit 7A and the chip selection generation circuit 6A and outputs a clock signal CLK. The NAND circuits 42 and 43 and the inverter 40 are supplied with the voltage Vdd of a node Z11.

When a nonstandard clock signal CLK or chip selection signal /CS is generated following abrupt step-down of the power supply voltage Vdd, stored data is destroyed in the synchronous SRAM 1. According to the ninth embodiment of the present invention, therefore, the control pulse generation circuit 44 is provided for preventing generation of a nonstandard clock signal CLK or chip selection signal /CS.

When an abrupt step-down of the power supply voltage Vdd is detected, the control pulse generation circuit 44 generates a control pulse signal on the basis of a signal on a node F. The aforementioned power down setup time is kept with the control pulse signal output from the control pulse generation circuit 44 for inactivating the chip selection signal /CS and the clock signal CLK.

The controller 30E supplies the chip selection signal /CS and the clock signal CLK to the synchronous SRAM 1. When the system power Vdd is abruptly stepped down, the chip selection signal /CS is set in a nonselective state (high) on the basis of a result of detection by the system power supply voltage detection circuit 33, for performing a clock stop operation.

The controller 5G performs control for setting the synchronous SRAM 1 in a power down mode/operating mode. In the power down mode, the voltage set circuit 4 steps down the power supply voltage Vdd beyond an operating potential on the basis of control by the controller 5G. Further, the logical level of the chip selection signal /CS is switched on the basis of control by the controller 5F, for performing the clock stop operation.

The chip selection signal /CS is switched to the nonselective state when executing the power down mode due to the aforementioned structure, for performing the clock stop operation. Thus, current consumption in the synchronous SRAM 1 is reduced. Power for the synchronous SRAM 1 is ensured with the backup circuit 32. Thus, stored data is protected.

Tenth Embodiment

Figure 18:
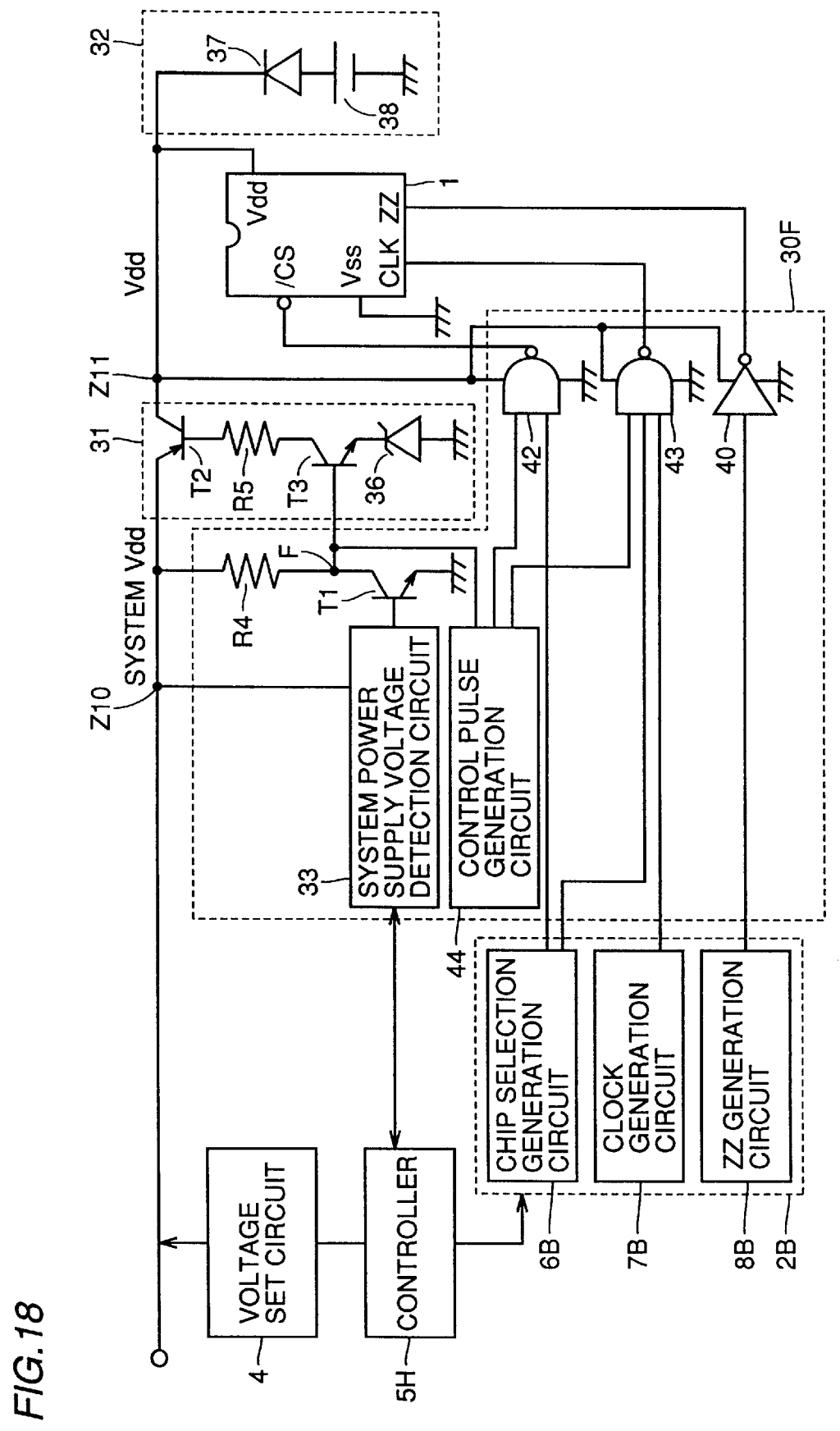

The semiconductor integrated circuit system according to the tenth embodiment of the present invention is described with reference to FIG. 18. The semiconductor integrated circuit system shown in FIG. 18 comprises a synchronous SRAM 1, a signal generation circuit 2B, a voltage set circuit 4, a controller 5H, a controller 30F, a stabilizing circuit 31 and a backup circuit 32. The controller 5H controls voltage setting in the voltage set circuit 4 and signal generation in the signal generation circuit 2B.

The controller 30F includes a system power supply voltage detection circuit 33, a resistive element R4, a transistor T1, NAND circuits 42 and 43, an inverter 40 and a control pulse generation circuit 44. The NAND circuit 42 receives outputs of the control pulse generation circuit 44 and a chip selection generation circuit 6B and outputs a chip selection signal /CS. The NAND circuit 43 serving as a clock buffer receives outputs from the control pulse generation circuit 44, a clock generation circuit 7B and the chip selection generation circuit 6B and outputs a clock signal CLK. The inverter 40 receives an output of a ZZ generation circuit 8B and outputs a snooze mode signal ZZ to the synchronous SRAM 1.

The controller 30F supplies the chip selection signal /CS and the clock signal CLK to the synchronous SRAM 1. When system power Vdd is abruptly stepped down, the chip selection signal /CS is set in a nonselective state (high) on the basis of a result of detection by the system power supply voltage detection circuit 33, for performing a clock stop operation. At this time, the aforementioned power down setup time is kept with the control pulse generation circuit 44 for inactivating the chip selection signal /CS and the clock signal CLK. The controller 30F asynchronously controls the synchronous SRAM 1 through the inverter 40 serving as a buffer for the snooze mode signal ZZ.

The controller 5H performs control for setting the synchronous SRAM 1 in a power down mode/operating mode. In the power down mode, the voltage set circuit 4 steps down the power supply voltage Vdd beyond an operating potential on the basis of control by the controller 5H. Further, the controller 5H switches the logical levels of the chip selection signal /CS and the snooze mode signal ZZ, for performing a clock stop operation.

The chip selection signal /CS is switched to the nonselective state when executing the power down mode due to the aforementioned structure, for performing the clock stop operation. Further, the snooze mode signal ZZ is switched high on the basis of control by the controller 5H. Thus, power consumption in the synchronous SRAM 1 is reduced. Power for the synchronous SRAM 1 is ensured with the backup circuit 32. Thus, stored data is protected.

Eleventh Embodiment

A semiconductor integrated circuit according to an eleventh embodiment of the present invention is described. According to the eleventh embodiment of the present invention, a column selection circuit connecting a memory cell with a sense amplifier and a circuit on a front stage of an output buffer form a register.

The overall structure of the semiconductor integrated circuit according to the eleventh embodiment of the present invention is described with reference to FIG. 19. The semiconductor integrated circuit shown in FIG. 19 comprises an internal CLK signal generation circuit 50 receiving an external clock EXTCLK and generating an internal clock, an internal control signal generation circuit 51 capturing external control signals (e.g., a chip enable signal /CE, a write enable signal /WE and an output enable signal /OE) and generating corresponding internal control signals, an address register 52 capturing an external address and outputting a corresponding internal address on the basis of control by the internal control signal generation circuit 51 and a memory cell array 53 including a plurality of memory cells arranged in rows and columns, a plurality of word lines corresponding to the rows and a plurality of bit lines corresponding to the columns. A row of the memory cell array 53 is selected on the basis of the internal address output from the address register 52. The internal control signal generation circuit 51 and the address register 52 operate in synchronization with the internal clock.

Figure 19:
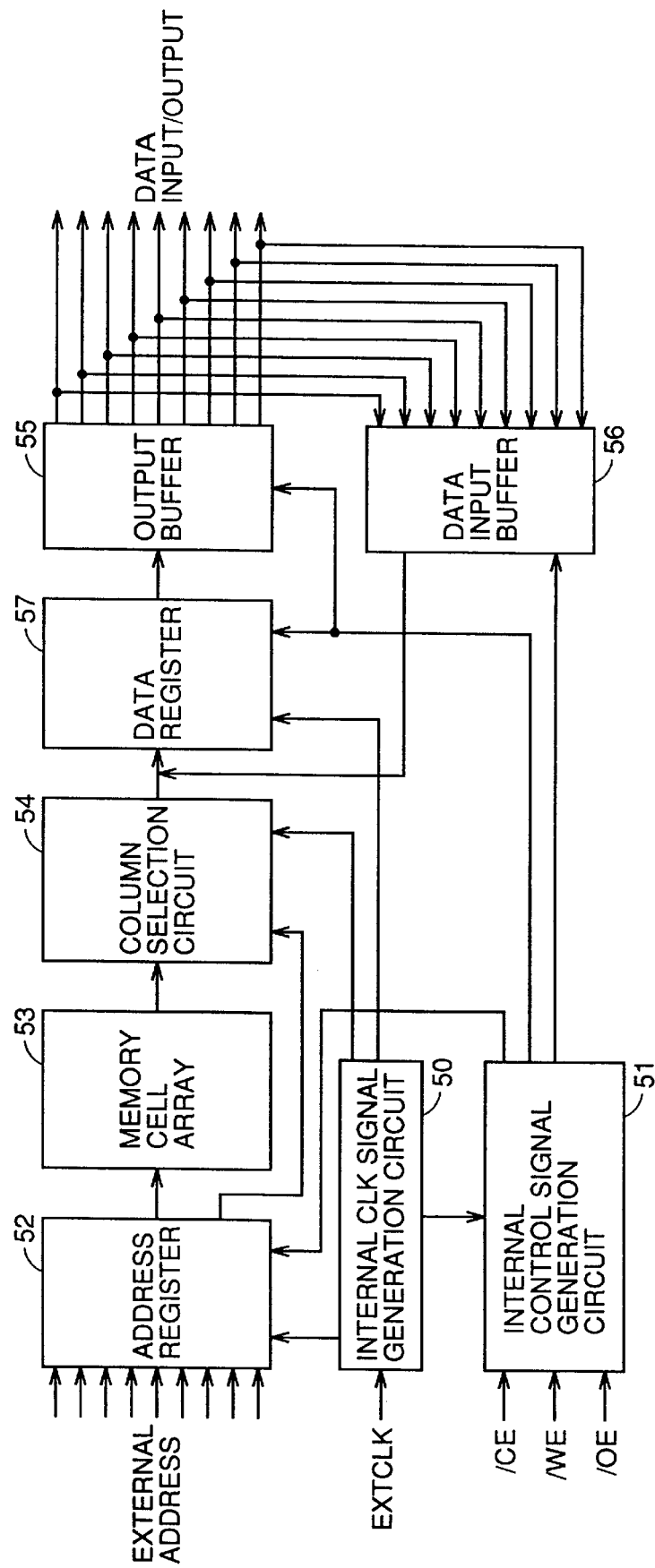
FIG. 19 illustrates the overall structure of a semiconductor integrated circuit according to an eleventh embodiment of the present invention.

The semiconductor integrated circuit shown in FIG. 19 further comprises a column selection circuit 54 performing selection in the column direction of the memory cell array 53 on the basis of the internal address output from the address register 52, an output buffer 55 receiving data from a selected memory cell and outputting the same on the basis of the internal control signal generation circuit 51, a data input buffer 56 capturing externally received write data on the basis of control by the internal control signal generation circuit 51 and a data register 57. The data register 57 captures the data read from the memory cell array 53 and outputs the same to the output buffer 55 on the basis of control by the internal control signal generation circuit 51. The column selection circuit 54 and the data register 57 operate in synchronization with the internal clock.

An exemplary structure of a principal part of the semiconductor integrated circuit according to the eleventh embodiment of the present invention is described with reference to FIG. 20. A column selection transfer gate 60 is arranged for bit lines BL and /BL. The column selection transfer gate 60 is formed by an NMOS transistor N20 and a PMOS transistor P20 corresponding to the bit line BL and an NMOS transistor N21 and a PMOS transistor P21 corresponding to the bit line /BL.

The transistors N20 and N21 are turned on by an output (column & CLK signal) of an AND circuit 61 receiving a column address output from the address register 52 and the internal clock (internal CLK). The transistors P20 and P21 are turned on by an output of an inverter 70A receiving the output of the AND circuit 61.

A sense amplifier 62 is arranged for the pair of bit lines BL and /BL. The sense amplifier 62 includes NMOS transistors N22, N23 and N24 and PMOS transistors P22 and P23. The transistor N24 is connected between ground power and first conducting terminals of the transistors N22 and N23, and turned on in response to an output (sense amplifier activation signal SE) of a delay circuit 63 delaying the output of the AND circuit 61. The transistor P22 is connected with power and a second conducting terminal of the transistor N22, and the transistor P23 is connected with the power and a second conducting terminal of the transistor N23.

The gates of the transistors P23 and N23 are connected to a node Z30 between the transistors N22 and P22. The gates of the transistors P22 and N22 are connected to a node Z31 between the transistors N23 and P23. When the transistors N20 and P20 are turned on, the node Z30 is electrically connected with the bit line BL. When the transistors N21 and P21 are turned on, the node Z31 is electrically connected with the bit line /BL.

An inverter 64 inverts a signal on the node Z30. An inverter 65 inverts a signal on the node Z31. NAND circuits 67 and 68 form a latch circuit 66, which latches outputs of the inverters 64 and 65.

A transfer gate 69 formed by an NMOS transistor N24 and a PMOS transistor P24 is arranged on an output node of the latch circuit 66. The transistor N24 is turned on in response to an output (internal /CLK) of an inverter 70B receiving the internal clock CLK, and the transistor P24 is turned on in response to an output of an inverter 71 receiving the internal clock /CLK.

A latch circuit 72 formed by inverters 73 and 74 is arranged between the transfer gate 69 and the output buffer 56. The node between an output node of the latch circuit 72 and the output buffer 56 is referred to as a prebuffer node Z32.

The column selection transfer gate 60 performing switching from the bit lines BL and /BL to the sense amplifier 62 is controlled with the value (column & CLK signal) obtained by ANDing the column address and the internal clock CLK. The sense amplifier 62 is activated with the sense amplifier activation signal SE obtained by delaying the column & CLK signal. An output node of the sense amplifier 62 is connected to the transfer gate 69 through the latch circuit 66. The transfer gate 69 is controlled with the internal clock /CLK obtained by inverting the internal clock CLK. The output buffer 56 is connected with the latch circuit 72 through the transfer gate 69.

Figure 20:
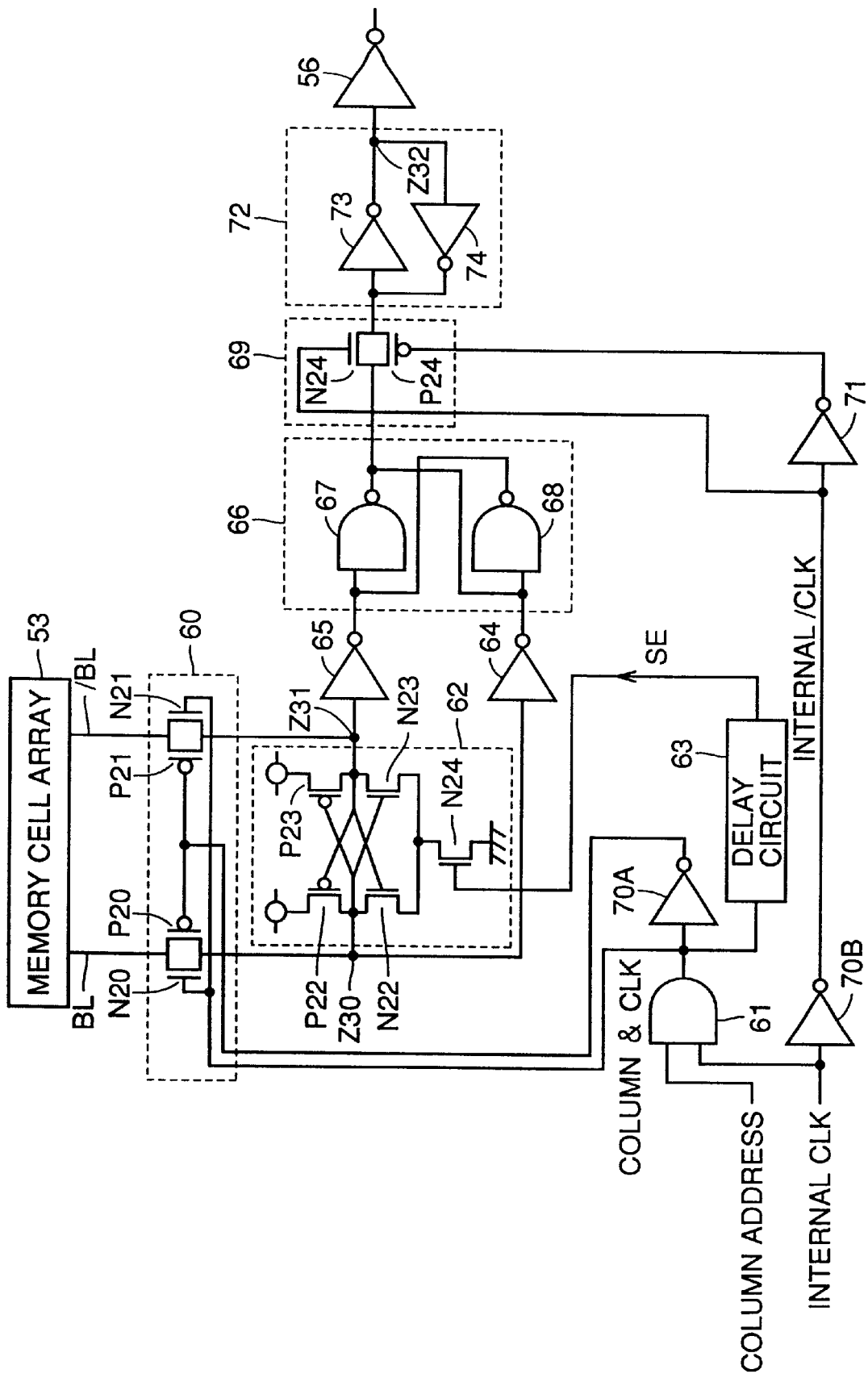
FIG. 20 is a circuit diagram showing an exemplary structure of a principal part of the semiconductor integrated circuit according to the eleventh embodiment of the present invention.
Figure 21:
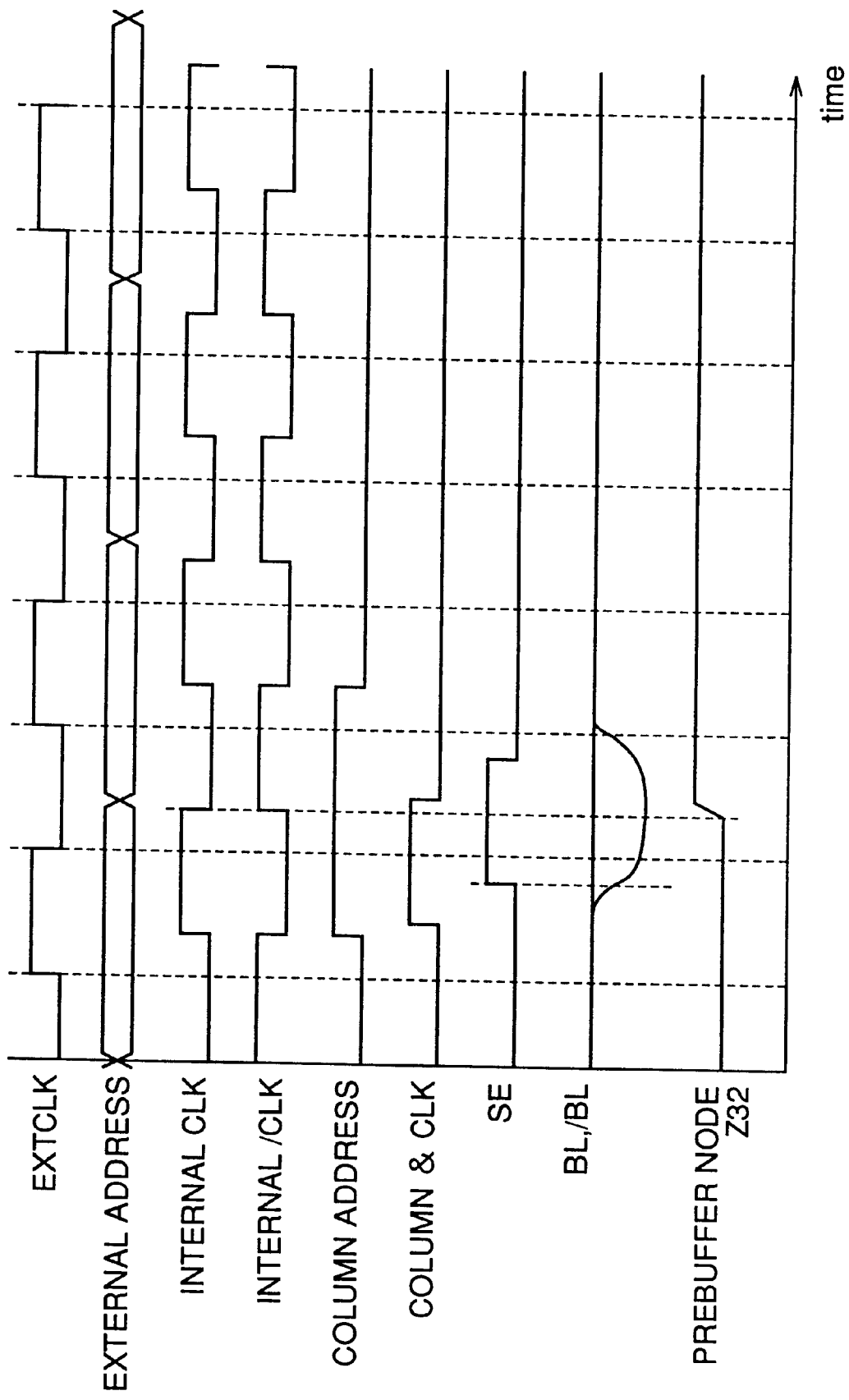
FIG. 21 is a timing chart showing operation timings in the circuit structure shown in FIG. 20.

Operation timings in the circuit structure shown in FIG. 20 are described with reference to FIG. 21. As shown in FIG. 21, the internal clock CLK is generated in correspondence to the externally input dock EXTCLK. The internal clock /CLK is out of phase with the internal clock CLK.

An external address is captured on the leading edge of the external clock EXTCLK so that the column address is generated. The column & CLK signal rises high with the column address and the internal clock CLK. Then, the sense amplifier activation signal SE obtained by delaying the column & CLK signal rises high for activating the sense amplifier 62. At this time, the potentials of the pair of bit lines BL and /BL change. When the internal clock CLK goes low (the internal clock /CLK goes high), the potential of the prebuffer node Z32 changes.

Another exemplary structure of the principal part of the semiconductor integrated circuit according to the eleventh embodiment of the present invention is described with reference to FIG. 22. The structure shown in FIG. 22 corresponds to a pipeline operation. In other words, this structure corresponds to the case of capturing an address upon first rise of an external clock EXTCLK and outputting data upon the second lise.

Figure 22:
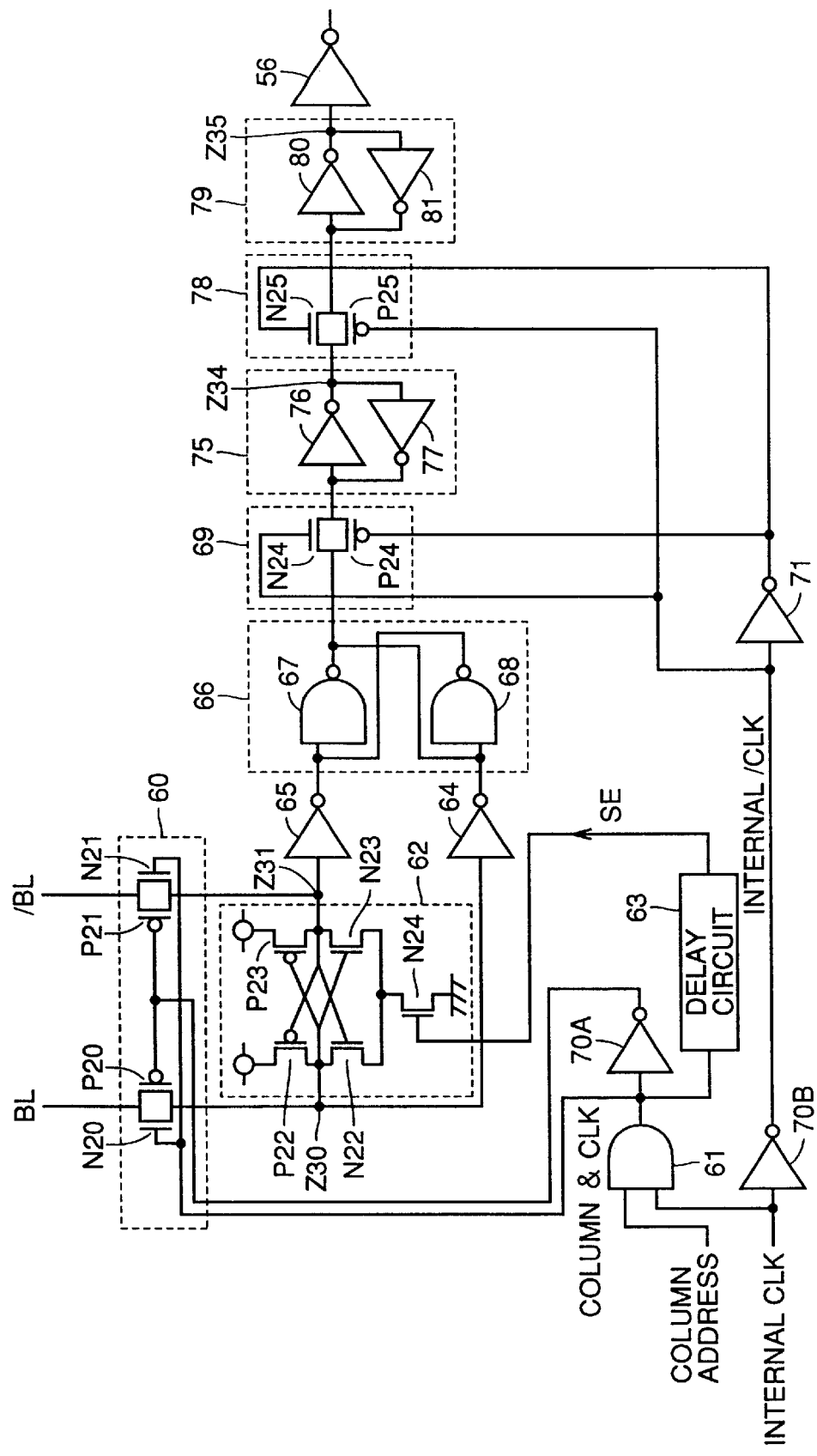
FIG. 22 is a circuit diagram showing another exemplary structure of the principal part of the semiconductor integrated circuit according to the eleventh embodiment of the present invention.

As shown in FIG. 22, a column selection transfer gate 60 is arranged for bit lines BL and /BL. Transistors N20 and N21 are turned on with a column & CLK signal output from an AND circuit 61, and transistors P20 and P21 are turned on with an output of an inverter 70A receiving the output of the AND circuit 61.

A sense amplifier 62 is arranged for the pair of bit lines BL and /BL. A transistor N24 is turned on in response to a sense amplifier activation signal SE output from a delay circuit 63.

A latch circuit 66 is arranged for the sense amplifier 62 through inverters 64 and 65. A latch circuit 75 formed by inverters 76 and 77 latches the value of the latch circuit 66 through a transfer gate 69. A latch circuit 79 formed by inverters 80 and 81 latches the value of the latch circuit 75 through a transfer gate 78.

The transfer gate 78 is formed by an NMOS transistor N25 and a PMOS transistor P25. The transistor N25 is turned on in response to an output of an inverter 71, and the transistor P25 is turned on in response to an internal clock /CLK.

The column selection transfer gate 60 performing switching from the bit lines BL and /BL to the sense amplifier 62 is controlled with the value (column & CLK signal) obtained by ANDing the column address and an internal clock CLK. The sense amplifier 62 is activated with the sense amplifier activation signal SE obtained by delaying the column & CLK signal. The output node of the sense amplifier 62 is connected to the transfer gate 69 through the latch circuit 66. The transfer gate 69 is controlled with the internal clock /CLK obtained by inverting the internal clock CLK. The transfer gate 69 is connected with the transfer gate 78 through the latch circuit 75. The transfer gate 78 is controlled in phase with the internal clock CLK. An output buffer 56 is connected with the latch circuit 79.

The node between the latch circuit 75 and the transfer gate 78 is referred to as a prebuffer node Z34. The node between the latch circuit 79 and the output buffer 56 is referred to as a prebuffer node Z35.

Figure 23:
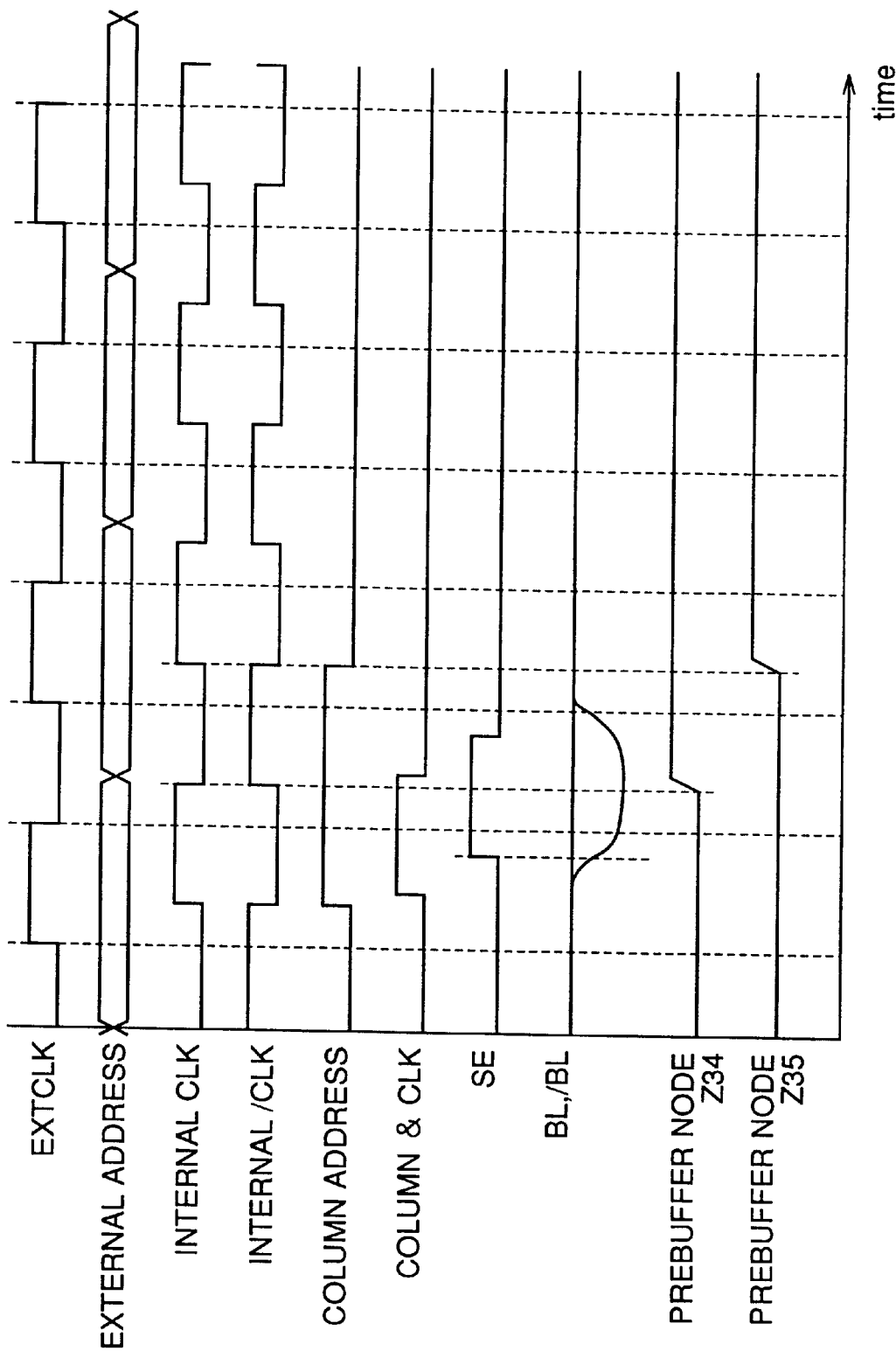
FIG. 23 is a timing chart showing operation timings in the circuit structure shown in FIG. 22.

Operation timings in the circuit structure shown in FIG. 22 are described with reference to FIG. 23. As shown in FIG. 23, the internal clock CLK is generated in correspondence to the external clock EXTCLK. The internal clock /CLK is out of phase with the internal clock CLK.

An external address is captured upon first rise of the external clock EXTCLK so that the column address is generated. The column & CLK signal rises high with the column address and the internal clock CLK. Then, the sense amplifier activation signal SE obtained by delaying the column & CLK signal rises high for activating the sense amplifier 62. At this time, the potentials of the pair of bit lines BL and /BL change.

When the internal clock goes low (the internal clock /CLK goes high), the potential of the prebuffer node Z34 changes.

Further, when the internal clock CLK goes high (the internal clock /CLK goes low) in response to a second external clock EXTCLK, the potential of the prebuffer node Z35 changes.

An internal read margin can be ensured due to the aforementioned structure. Further, a latch-type sense amplifier having low current consumption can be employed by controlling the register with the clock signals. Further, device design is simplified.

Twelfth Embodiment

A semiconductor integrated circuit according to a twelfth embodiment of the present invention is described. According to the twelfth embodiment of the present invention, power consumption in operation is reduced by controlling the timing for activating a word line.

Figure 24:
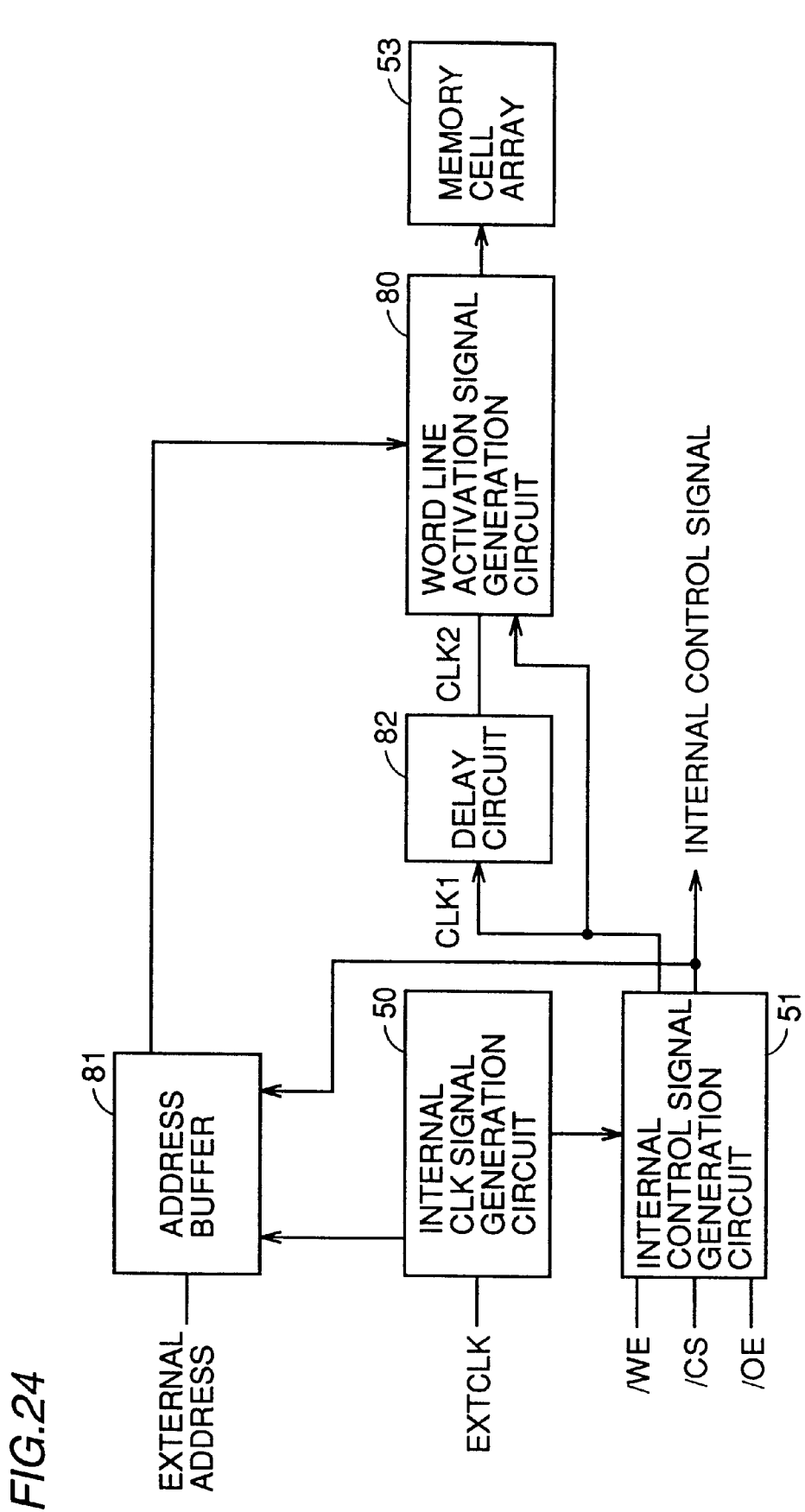
FIG. 24 illustrates the overall structure of a semiconductor integrated circuit according to a twelfth embodiment of the present invention.

The overall structure of the semiconductor integrated circuit according to the twelfth embodiment of the present invention is described with reference to FIG. 24. The semiconductor integrated circuit shown in FIG. 24 comprises an internal CLK signal generation circuit 50, an internal control signal generation circuit 51, an address buffer 81, a memory cell array 53, a word line activation signal generation circuit 80 generating a word line activation signal for activating a word line and a delay circuit 82.

The internal CLK signal generation circuit 50 receives an external clock EXTCLK and generates an internal clock. The internal control signal generation circuit 51 receives external control signals (a write enable signal /WE, a chip selection signal /CS and an output enable signal /OE) and generates internal control signals, while receiving the output of the internal CLK signal generation circuit 50 and outputting an internal clock CLK1. The address buffer 81 receives an external address. The delay circuit 82 receives the output of the internal control signal generation circuit 51 and generates an internal clock CLK2 obtained by delaying the internal clock CLK1. The word line activation signal generation circuit 80 decides an active period for the word line activation signal on the basis of the internal clocks CLK1 and CLK2. A word line corresponding to the input external address is selected with the word line activation signal.

The internal control signal generation circuit 51 and the address buffer 81 operate in synchronization with the output of the internal CLK signal generation circuit 50.

A first exemplary activation timing for the word line activation signal is described. The word line activation signal generation circuit 80 raises the word line activation signal on the leading edge of the internal clock CLK1 and lowers the word line activation signal on the leading edge of the internal clock CLK2 or on the next leading edge of the internal clock CLK1.

Figure 25:
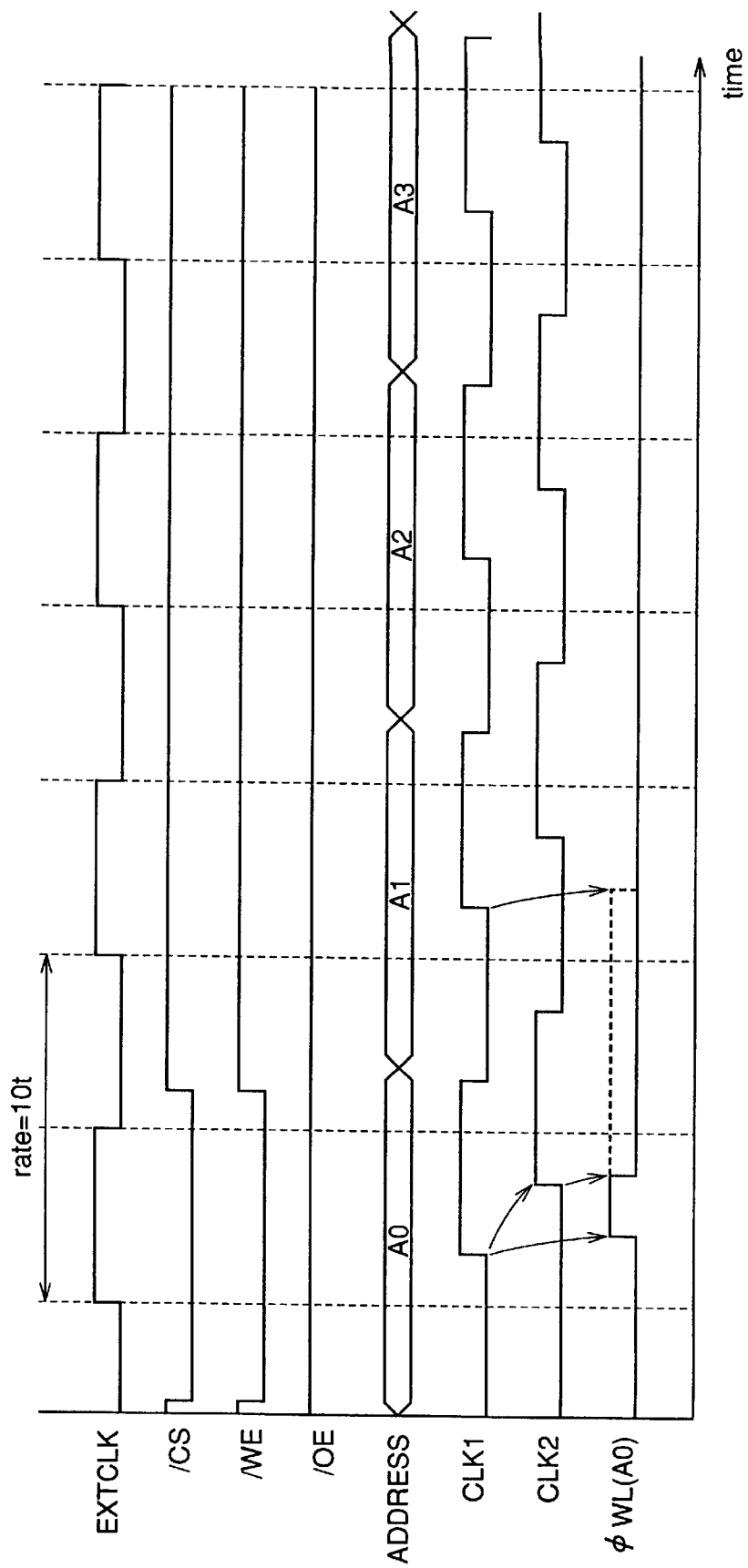
FIG. 25 is a timing chart for illustrating an exemplary first activation timing for a word line activation signal according to the twelfth embodiment of the present invention.
Figure 26:
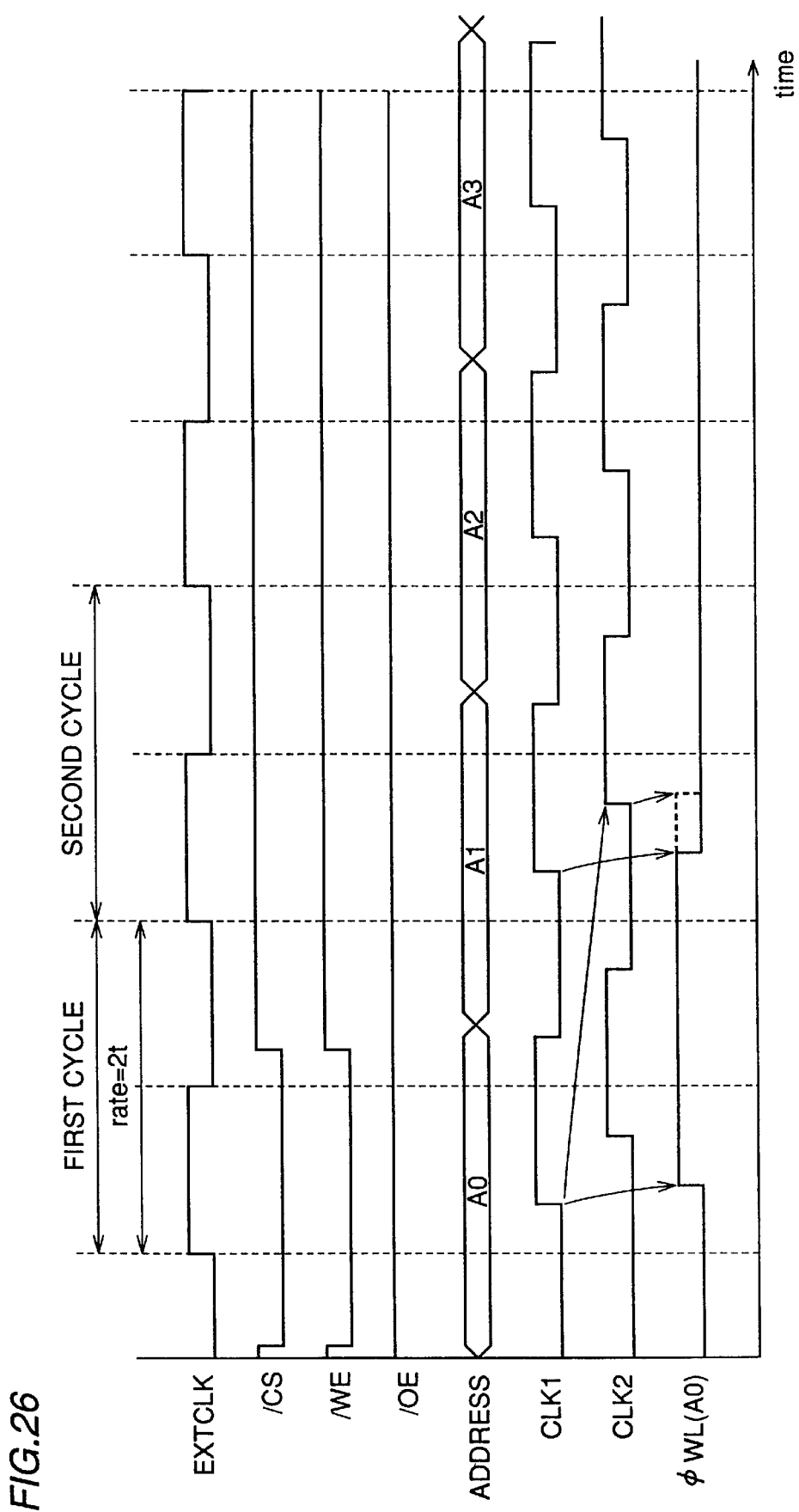
FIGS. 26 to 30 are timing charts for illustrating exemplary first to third activation timings for the word line activation signal according to the twelfth embodiment of the present invention.

The first exemplary activation timing is described with reference to FIGS. 25 and 26. Referring to FIG. 25, the external clock EXTCLK has a long clock cycle (the cycle rate is 10t). The internal clock CLK1 is generated in response to the external clock EXTCLK. The internal clock CLK2 rises high after a lapse of a prescribed period after the internal clock CLK1 rises high. The internal clock CLK2 falls low after a lapse of a prescribed period after the internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 when the internal clock CLK1 rises high, and lowers the word line activation signal φWL when the internal clock CLK2 rises high.

In other words, the period for selectively driving the word line is decided by the period between the rise of the internal clock CLK1 and the rise of the internal clock CLK2. The active period of the word line activation signal φWL is shorter than that in the case of lowering the word line activation signal φWL on the next leading edge of the internal clock CLK1. Referring to FIG. 26, the external clock EXTCLK has a short clock cycle (the cycle rate is 2t). A first internal clock CLK1 is generated in response to a first external clock EXTCLK. A first internal clock CLK2 rises high after a lapse of a prescribed period after the first internal clock CLK1 rises high, and the first internal clock CLK2 falls low after a lapse of a prescribed period after the first internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 when the first internal clock CLK1 rises high.

A second internal clock CLK1 is generated in response to a second external clock EXTCLK. A second internal clock CLK2 rises high after a lapse of a prescribed period after the second internal clock CLK1 rises high, and the second internal clock CLK2 falls low after a lapse of a prescribed period after the second internal clock CLK1 falls low.

The word line activation signal generation circuit 80 lowers the word line activation signal φWL when the second internal clock CLK1 rises.

In other words, the period for selectively driving the word line is decided by the period between the rise of the internal clock CLK1 and the rise of the next internal clock CLK1. The active period of the word line activation signal φWL is shorter than that in the case of lowering the word line activation signal φWL on the leading edge of the second internal clock CLK2.

A second exemplary activation timing for the word line activation signal is described. The word line activation signal generation circuit 80 raises the word line activation signal on the leading edge of the internal clock CLK1, and lowers the word line activation signal on the trailing edge of the internal clock CLK2 or on the next leading edge of the internal clock CLK1.

Figure 27:
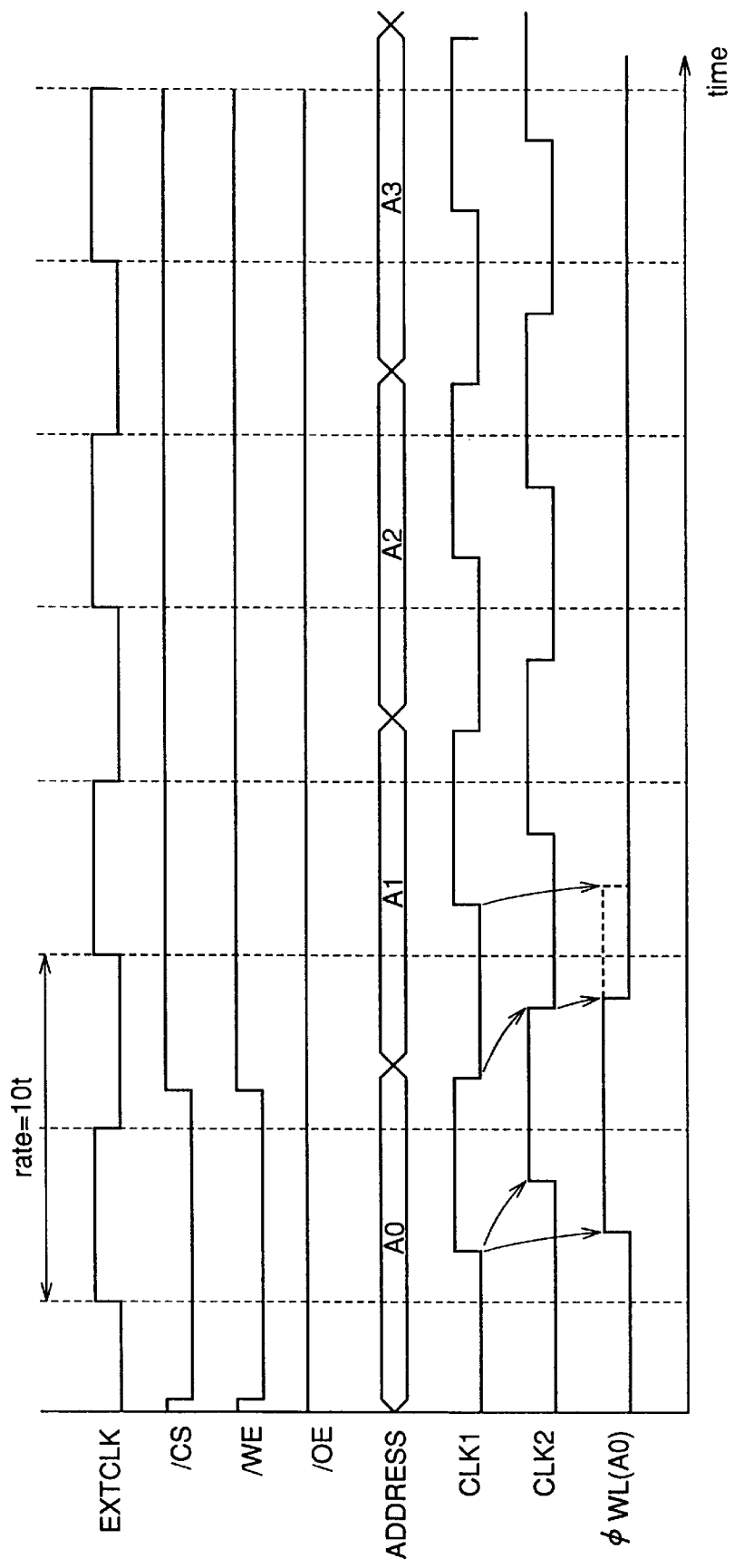

The second exemplary activation timing is described with reference to FIGS. 27 and 28. Referring to FIG. 27, the external clock EXTCLK has a long clock cycle (the cycle rate is 10t). The internal clock CLK1 is generated in response to the external clock EXTCLK. The internal clock CLK2 rises high after a lapse of a prescribed period after the internal clock CLK1 rises high. The internal clock CLK2 falls low after a lapse of a prescribed period after the internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 when the internal clock CLK1 rises high, and lowers the word line activation signal φWL when the internal clock CLK2 falls low.

In other words, the period for selectively driving the word line is decided by the period between the rise of the internal clock CLK1 and the fall of the internal clock CLK2. The active period of the word line activation signal φWL is shorter than that in the case of lowering the word line activation signal φWL on the next leading edge of the internal clock CLK1.

Figure 28:
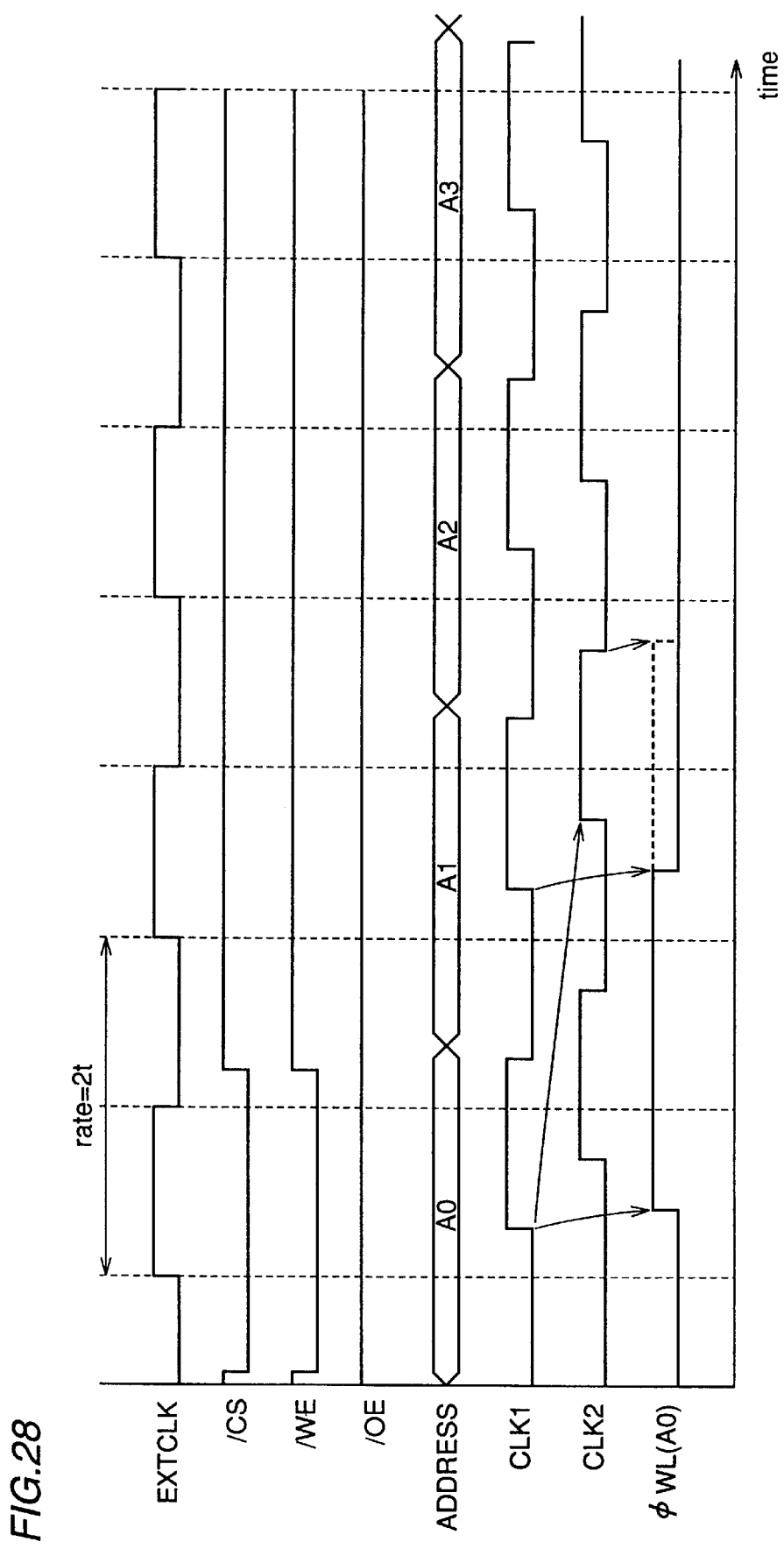

Referring to FIG. 28, the external clock EXTCLK has a short clock cycle (the cycle rate is 2t). A first internal clock CLK1 is generated in response to a first external clock EXTCLK. A first internal clock CLK2 rises high after a lapse of a prescribed period after the first internal clock CLK1 rises high, and the first internal clock CLK2 falls low after a lapse of a prescribed period after the first internal clock CLK1 falls low.

It is assumed that the chip selection signal /CS and the write enable signal /WE are low and the output enable signal /OE is high. An address A0 is captured.

In this case, the word line activation signal generation circuit 80 lowers a word line activation signal φWL corresponding to the address A0 high when the first internal clock CLK1 rises high.

A second internal clock CLK1 is generated in response to a second external clock EXTCLK. A second internal clock CLK2 rises high after a lapse of a prescribed period after the second internal clock CLK1 rises high, and the second internal clock CLK2 falls low after a lapse of a prescribed period after the second internal clock CLK1 falls low.

The word line activation signal generation circuit 80 lowers the word line activation signal φWL in response to the rise of the second internal clock CLK1.

In other words, the period for selectively driving the word line is decided by the period between the rise of the internal clock CLK1 and the rise of the next internal clock CLK1. The active period of the word line activation signal φWL is shorter than that in the case of lowering the word line activation signal φWL on the next trailing edge of the second internal clock CLK2.

A third exemplary activation timing for the word line activation signal is described. The word line activation signal generation circuit 80 raises the word line activation signal on the leading edge of the internal clock CLK1, and lowers the word line activation signal on the leading edge of the internal clock CLK2 or on the trailing edge of the internal clock CLK1.

Figure 29:
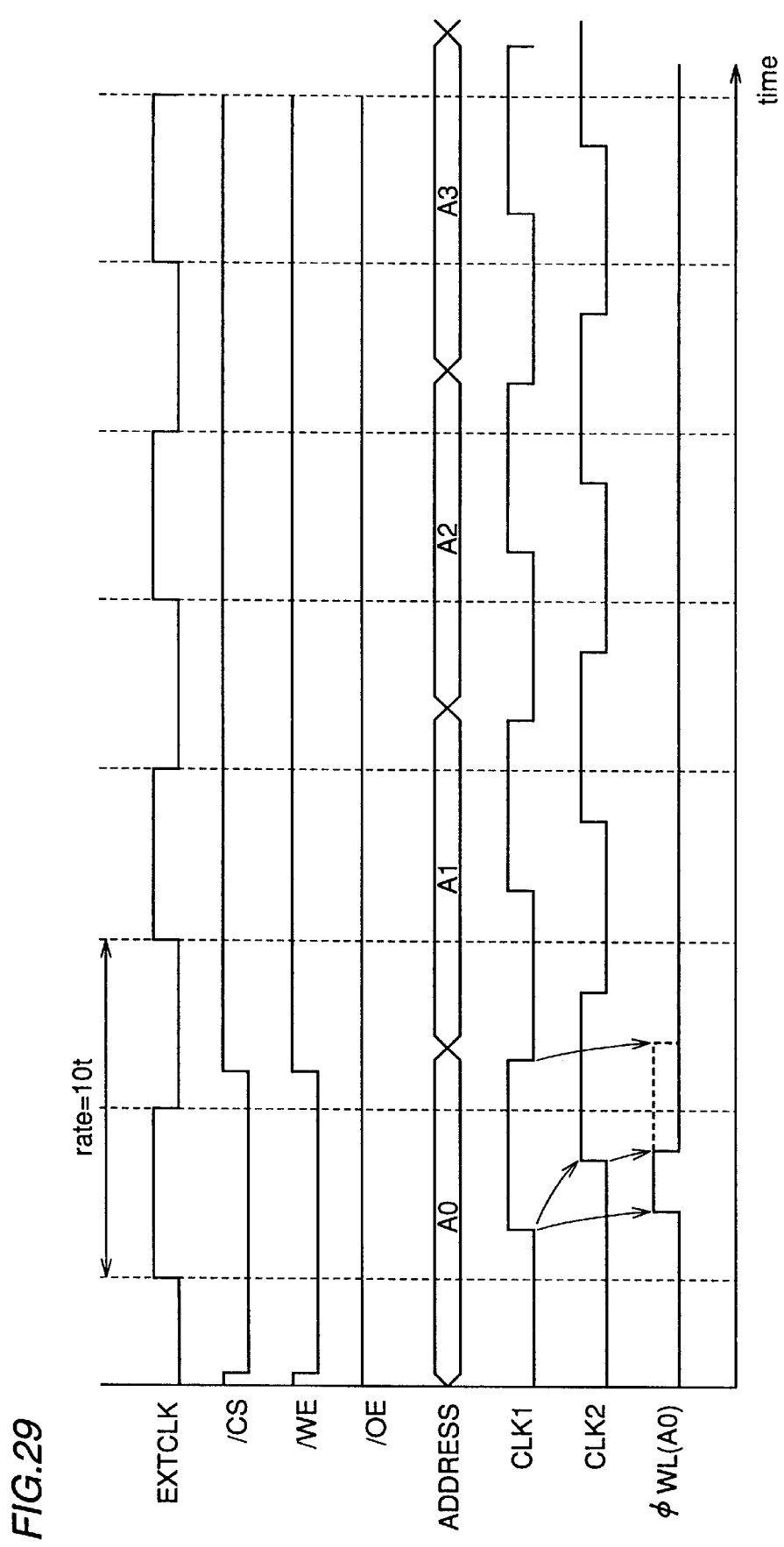

The third exemplary activation timing is described with reference to FIGS. 29 and 30. Referring to FIG. 29, the external clock EXTCLK has a long clock cycle (the cycle rate is 10t). The internal clock CLK1 is generated in response to the external dock EXTCLK. The internal clock CLK2 rises high after a lapse of a prescribed period after the internal clock CLK1 rises high. The internal clock CLK2 falls low after a lapse of a prescribed period after the internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 when the internal clock CLK1 rises high, and lowers the word line activation signal φWL when the internal clock CLK2 rises high.

In other words, the period for selectively driving the word line is decided by the period between the rise of the internal clock CLK1 and the rise of the internal clock CLK2. The active period of the word line activation signal φWL is shorter than that in the case of lowering the word line activation signal φWL on the trailing edge of the internal clock CLK1.

Figure 30:
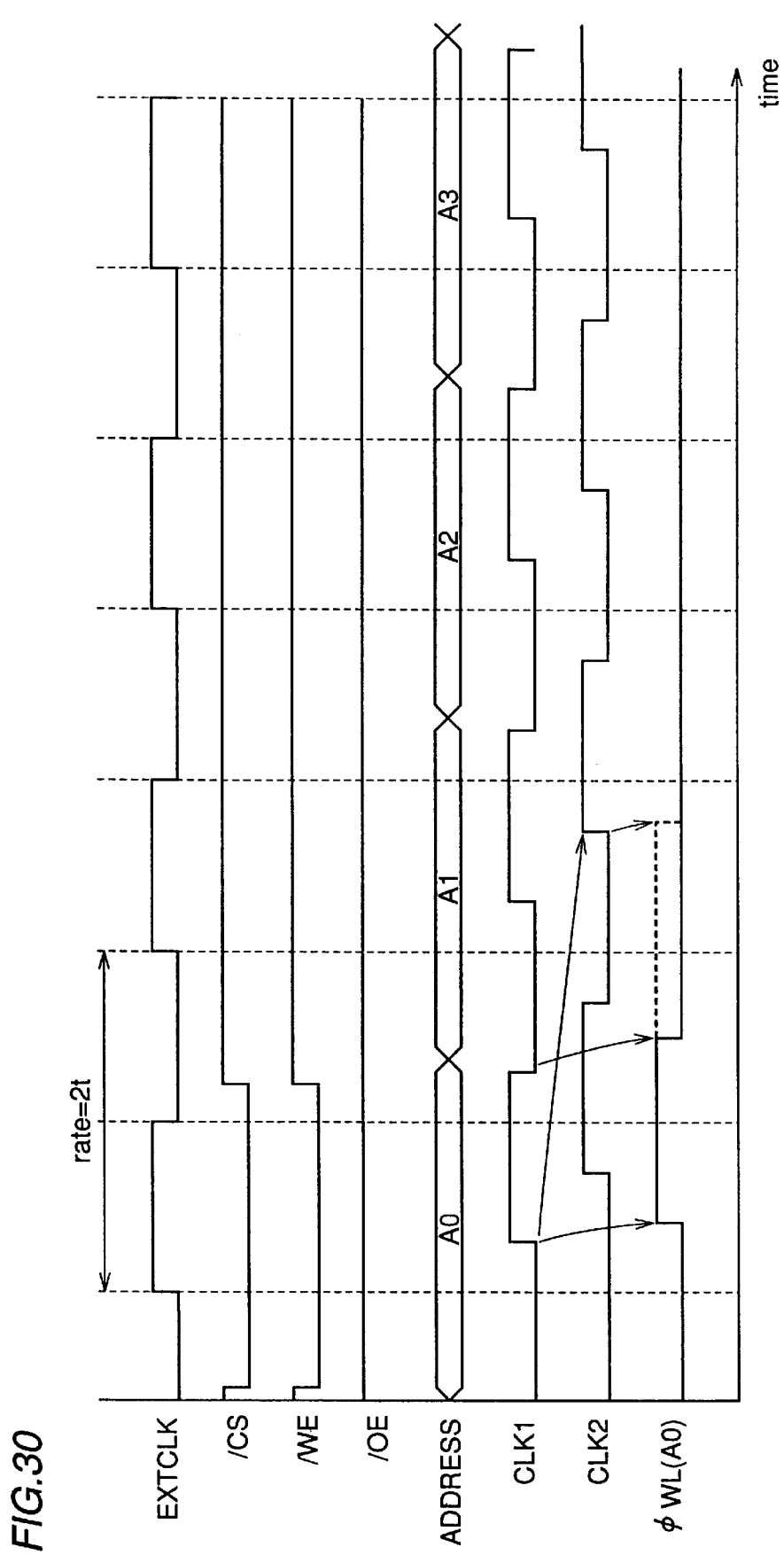

Referring to FIG. 30, the external clock EXTCLK has a short clock cycle (the cycle rate is 2t). A first internal clock CLK1 is generated in response to a first external clock EXTCLK. A first internal clock CLK2 rises high after a lapse of a prescribed period after the first internal clock CLK1 rises high, and the first internal clock CLK2 falls low after a lapse of a prescribed period after the first internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 high when the first internal clock CLK1 rises high, and lowers the word line activation signal φWL in response to fall of the first internal clock CLK1.

In other words, the period for selectively driving the word line is decided by the active period of the internal clock CLK1. The active period of the word line activation signal φWL is shorter than that in the case of lowering the word line activation signal φWL on the leading edge of the next (second) internal clock CLK2.

Thus, the period for selectively driving the word line can be controlled by employing two internal clocks. Consequently, power consumption in operation is reduced.

Thirteenth Embodiment

A semiconductor integrated circuit according to a thirteenth embodiment of the present invention is described. The semiconductor integrated circuit according to the thirteenth embodiment of the present invention is identical in basic structure to that according to the twelfth embodiment. An activation timing for a word line activation signal according to the thirteenth embodiment of the present invention is now described.

Figure 31:
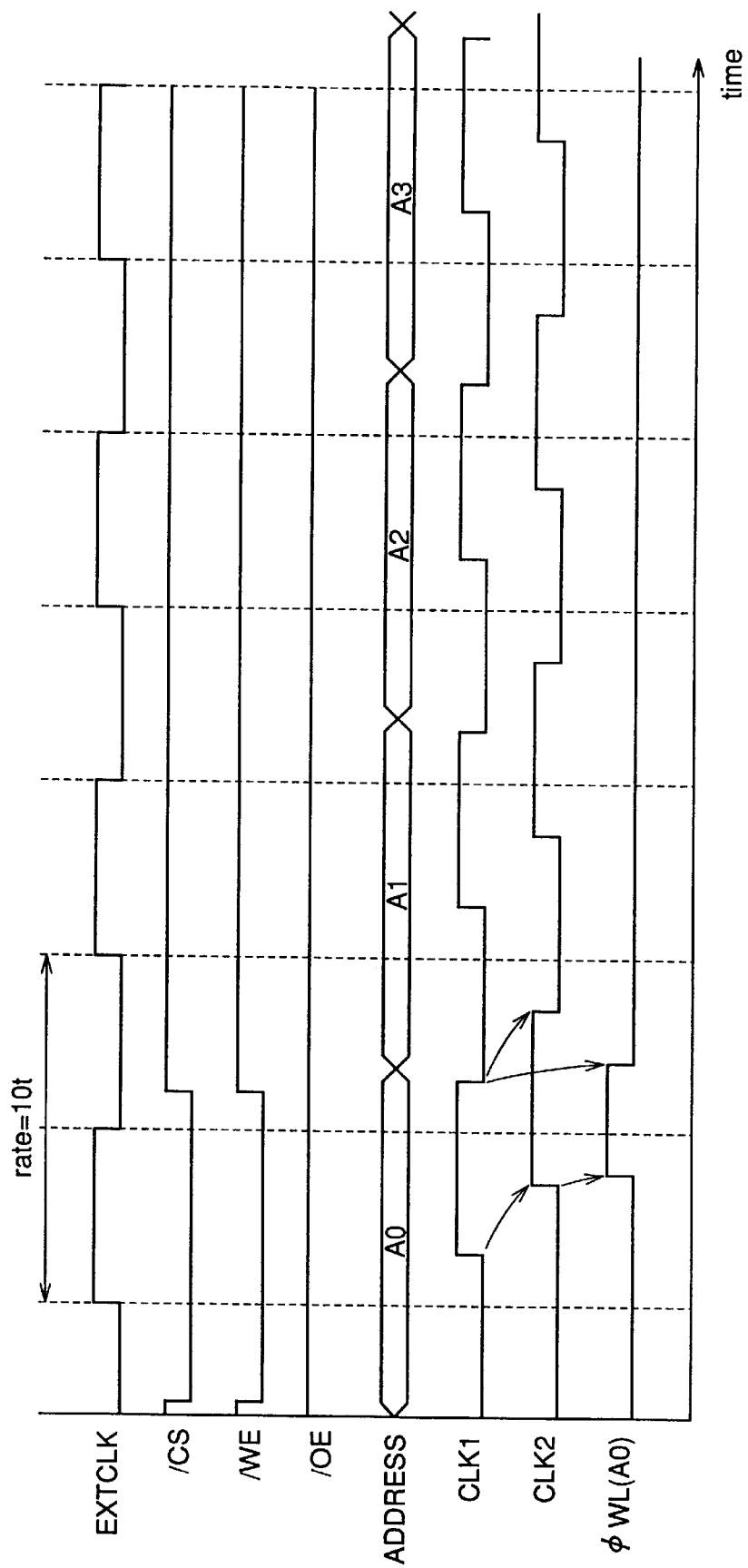
FIGS. 31 and 32 are timing charts for illustrating exemplary first and second activation timings for a word line activation signal according to a thirteenth embodiment of the present invention.

A first exemplary activation timing for the word line activation signal is described with reference to FIG. 31. Referring to FIG. 31, an external clock EXTCLK has a long clock cycle (the cycle rate is 10t). An internal clock CLK1 is generated in response to the external clock EXTCLK. An internal clock CLK2 rises high after a lapse of a prescribed period after the internal clock CLK1 rises high. The internal clock CLK2 falls low after a lapse of a prescribed period after the internal clock CLK1 falls low.

It is assumed that a chip selection signal /CS and a write enable signal /WE are low and an output enable signal /OE is high. An address A0 is captured.

In this case, a word line activation signal generation circuit 80 raises a word line activation signal φWL corresponding to the address A0 when the internal clock CLK2 rises high, and lowers the word line activation signal φWL when the internal clock CLK1 falls low.

Figure 32:
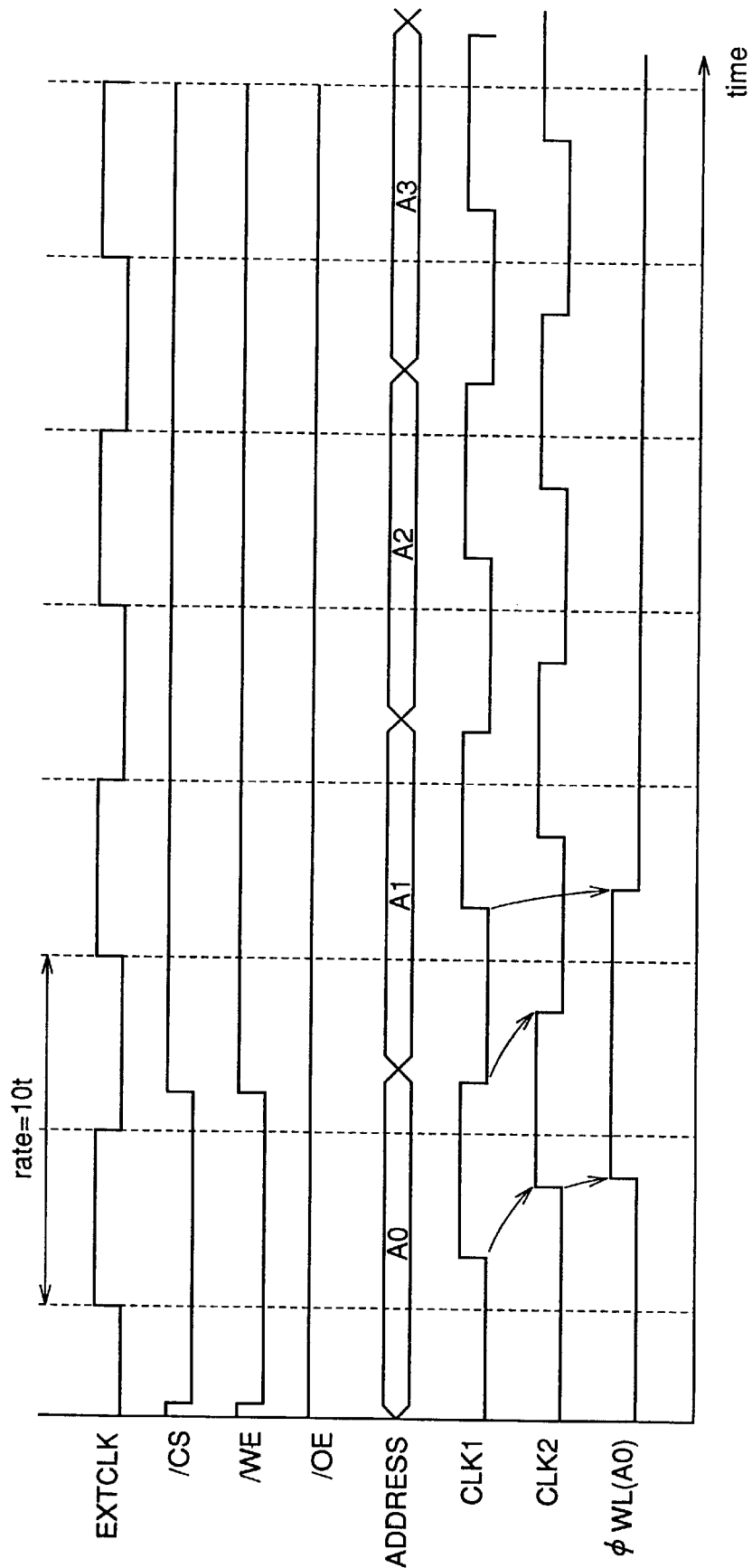

A second exemplary activation timing is described with reference to FIG. 32. Referring to FIG. 32, the external clock EXTCLK has a long clock cycle (the cycle rate is 10t). A first internal clock CLK1 is generated in response to a first external clock EXTCLK. A first internal clock CLK2 rises high after a lapse of a prescribed period after the first internal clock CLK1 rises high, and the first internal clock CLK2 falls low after a lapse of a prescribed period after the first internal clock CLK1 falls low.

It is assumed that the chip selection signal /CS and the write enable signal /WE are low and the output enable signal /OE is high. An address A0 is captured.

In this case, the word line activation signal generation circuit 80 raises a word line activation signal φWL corresponding to the address A0 when the first internal clock CLK1 rises high.

A second internal clock CLK1 is generated in response to a second external clock EXTCLK. A second internal clock CLK2 rises high after a lapse of a prescribed period after the second internal clock CLK1 rises high, and the second internal clock CLK2 falls low after a lapse of a prescribed period after the second internal clock CLK1 falls low.

The word line activation signal generation circuit 80 lowers the word line activation signal φWL in response to the rise of the second internal clock CLK1.

In other words, the word line activation signal generation circuit 80 raises the word line activation signal on the leading edge of the internal clock CLK2 obtained by delaying the internal clock CLK1, and lowers the word line activation signal on the leading edge of the next internal clock CLK1.

Thus, the period for selectively driving the word line can be controlled by employing two internal clocks. Consequently, power consumption in operation is reduced.

Fourteenth Embodiment

A semiconductor integrated circuit according to a fourteenth embodiment of the present invention is described. The semiconductor integrated circuit according to the fourteenth embodiment of the present invention controls an activation timing for a word line while varying an activation timing for a word line activation signal with read and write operations.

Figure 33:
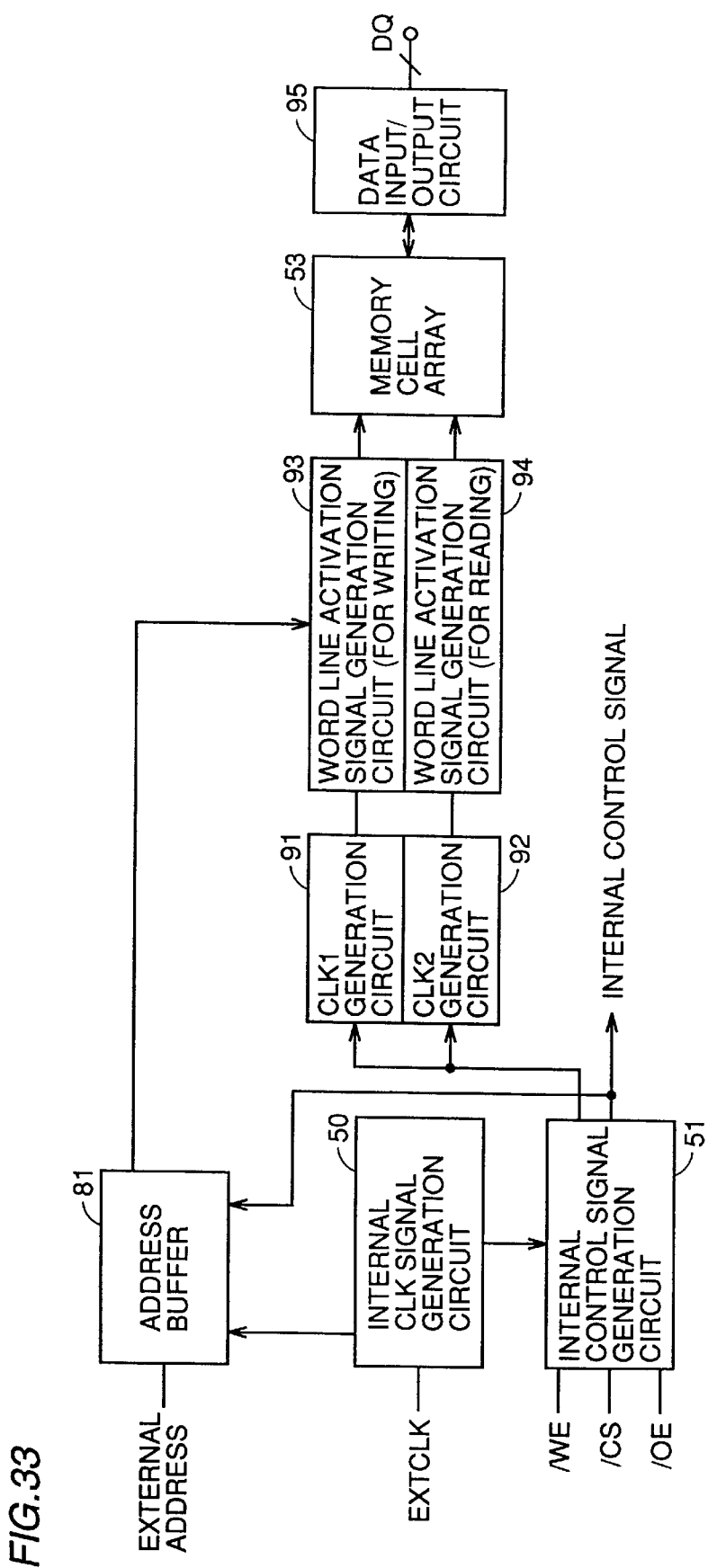
FIG. 33 illustrates the overall structure of a semiconductor integrated circuit according to a fourteenth embodiment of the present invention.

The overall structure of the semiconductor integrated circuit according to the fourteenth embodiment of the present invention is described with reference to FIG. 33. The semiconductor integrated circuit shown in FIG. 33 comprises an internal CLK signal generation circuit 50, an internal control signal generation circuit 51, an address buffer 81, a memory cell array 53, a CLK1 generation circuit 91 generating an internal clock CLK1 on the basis of an output from the internal control signal generation circuit 51, a CLK2 generation circuit 92 generating an internal clock CLK2 on the basis of the output from the internal control signal generation circuit 51, a word line activation signal generation circuit 93 generating a word line activation signal for activating a word line in a write operation, a word line activation signal generation circuit 94 generating a word line activation signal for activating a word line in a read operation and a data input/output circuit 95.

The word line activation signal generation circuit 93 decides the activation timing for the word line activation signal in response to the internal clock CLK1. The word line activation signal generation circuit 94 decides the activation timing for the word line activation signal in response to the internal clock CLK2.

Both of the internal clocks CLK1 and CLK2 are obtained by delaying the rise timing of an internal clock output from the internal clock signal generation circuit 50 (or an external clock EXTCLK) by a constant time. A high-level period of the internal clock CLK2 is set shorter than that of the internal clock CLK1.

The word line activation signal generation circuit 93 raises the word line activation signal on the leading edge of the internal clock CLK1, and lowers the word line activation signal on the trailing edge of the internal clock CLK1. The word line activation signal generation circuit 94 raises the word line activation signal on the leading edge of the internal clock CLK2, and lowers the word line activation signal on the trailing edge of the internal clock CLK2.

Figure 34:
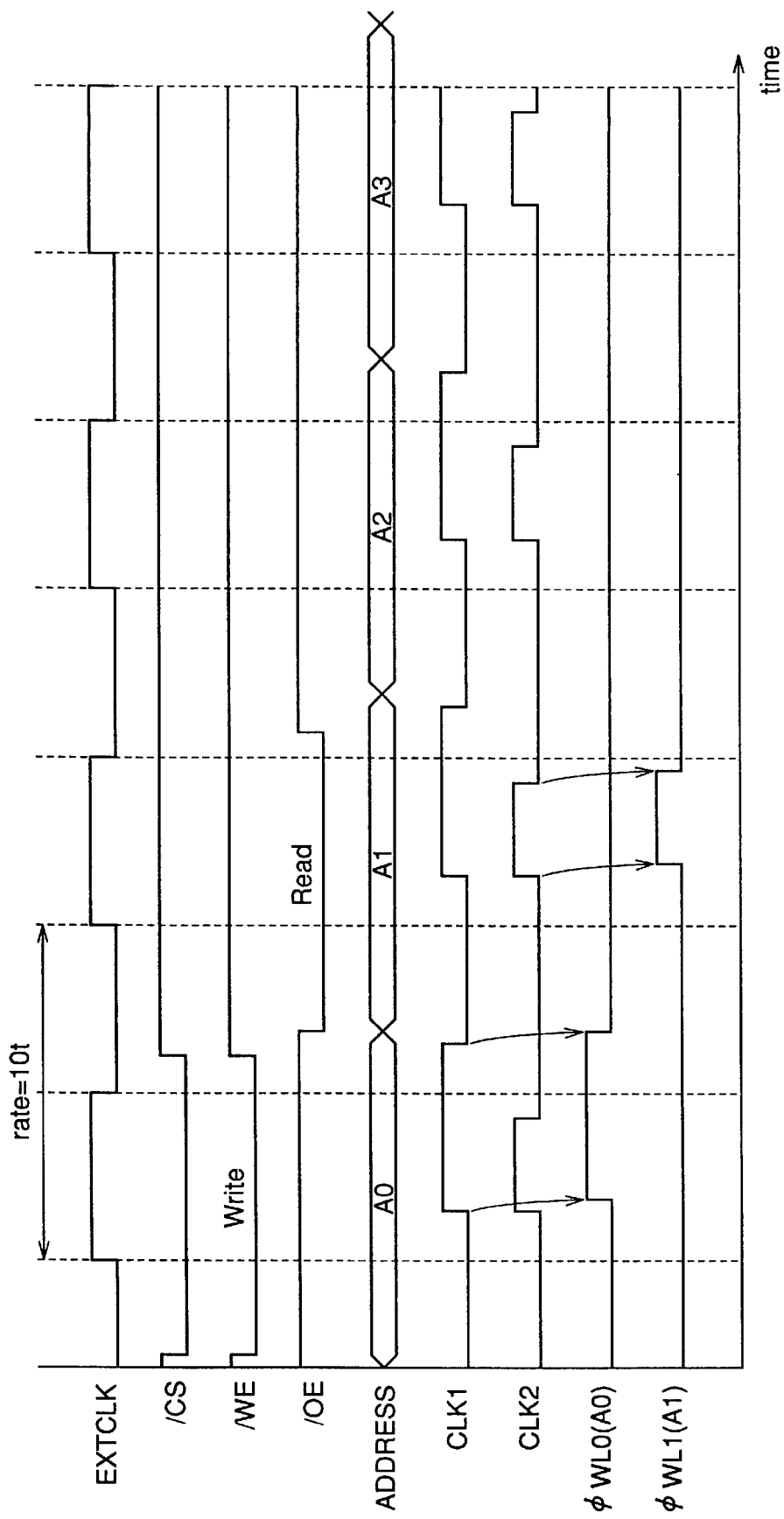
FIG. 34 is a timing chart for illustrating an exemplary activation timing for a word line activation signal according to the fourteenth embodiment of the present invention.
Figure 35:
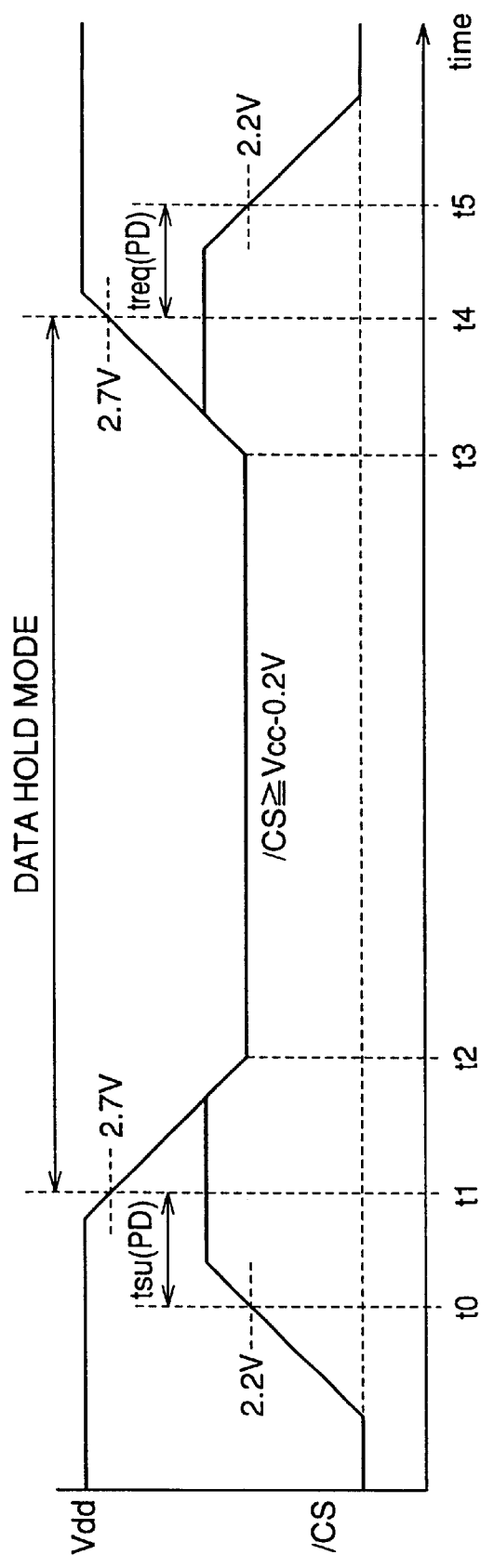
FIG. 35 is a timing chart for illustrating a data hold mode in a conventional asynchronous SRAM.
Figure 36A:
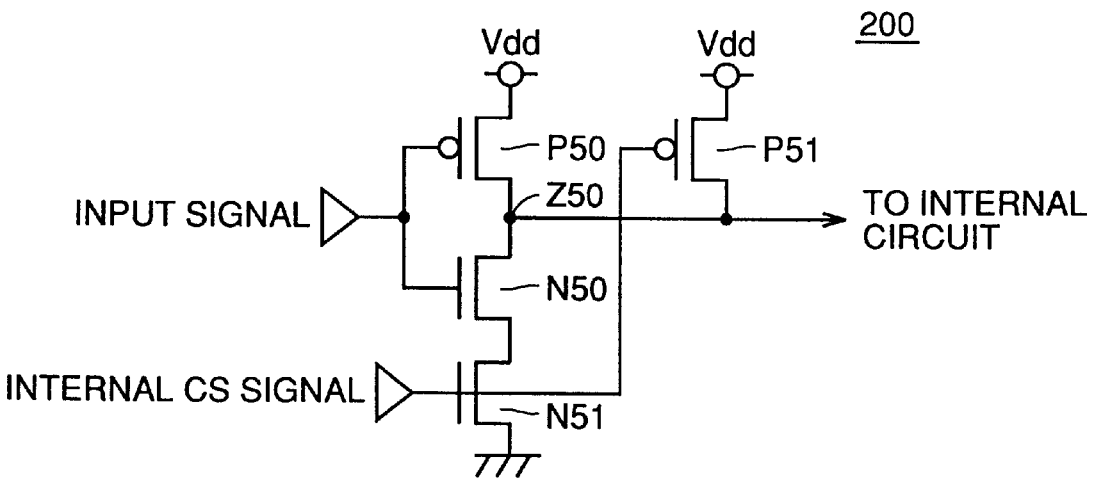
FIGS. 36A and 36B illustrate exemplary input circuits included in the asynchronous SRAM.
Figure 36B:
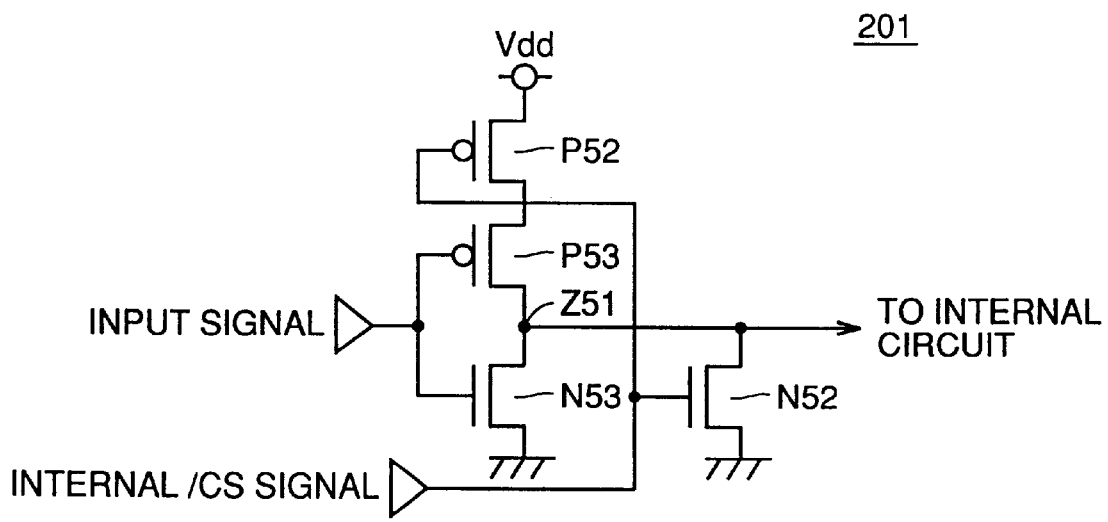
Figure 37:
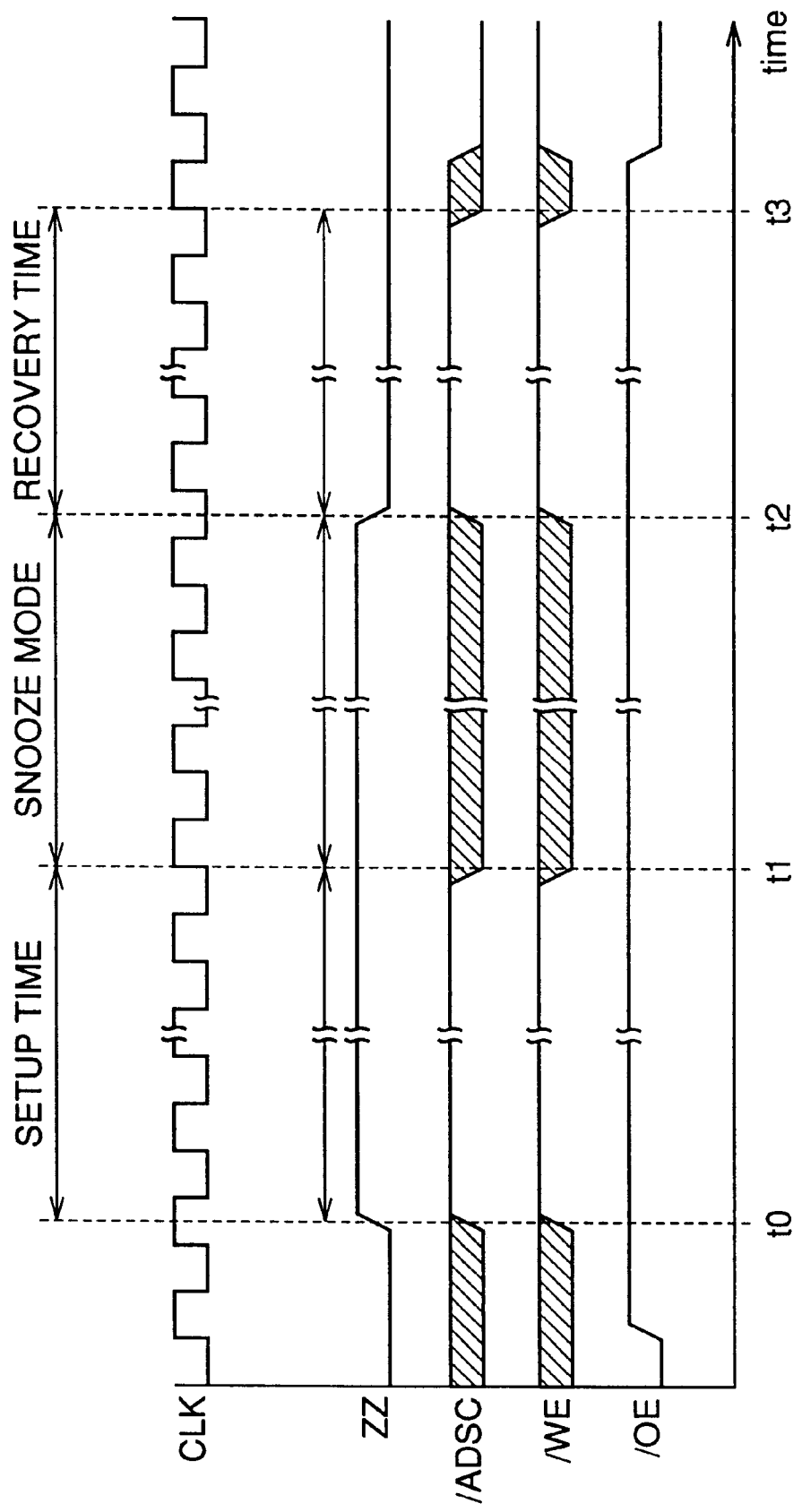
FIG. 37 is a timing chart for illustrating a snooze mode in a conventional synchronous SRAM.
Figure 38A:
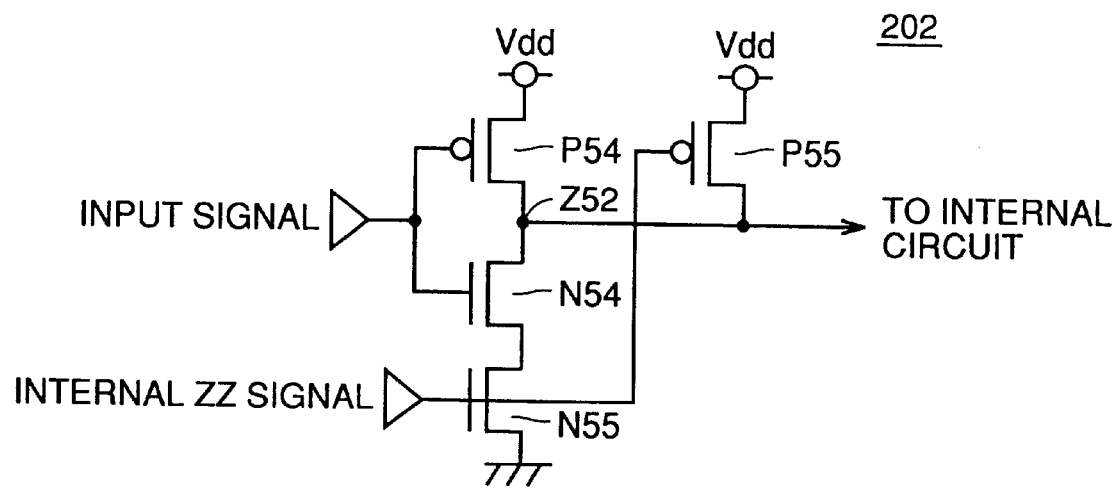
FIGS. 38A and 38B illustrate exemplary input circuits having a snooze mode function included in the synchronous SRAM.
Figure 38B:
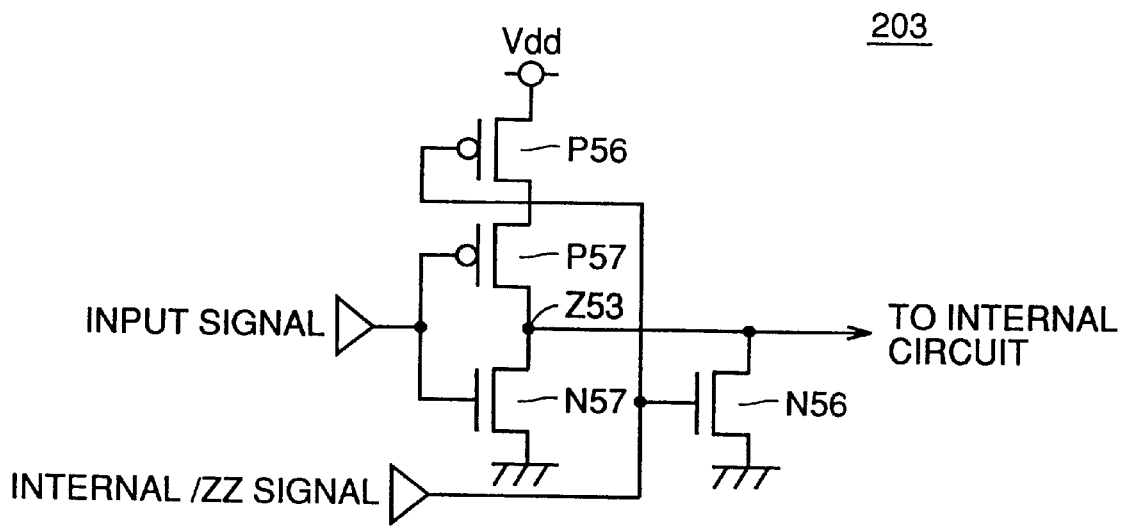
Figure 39:
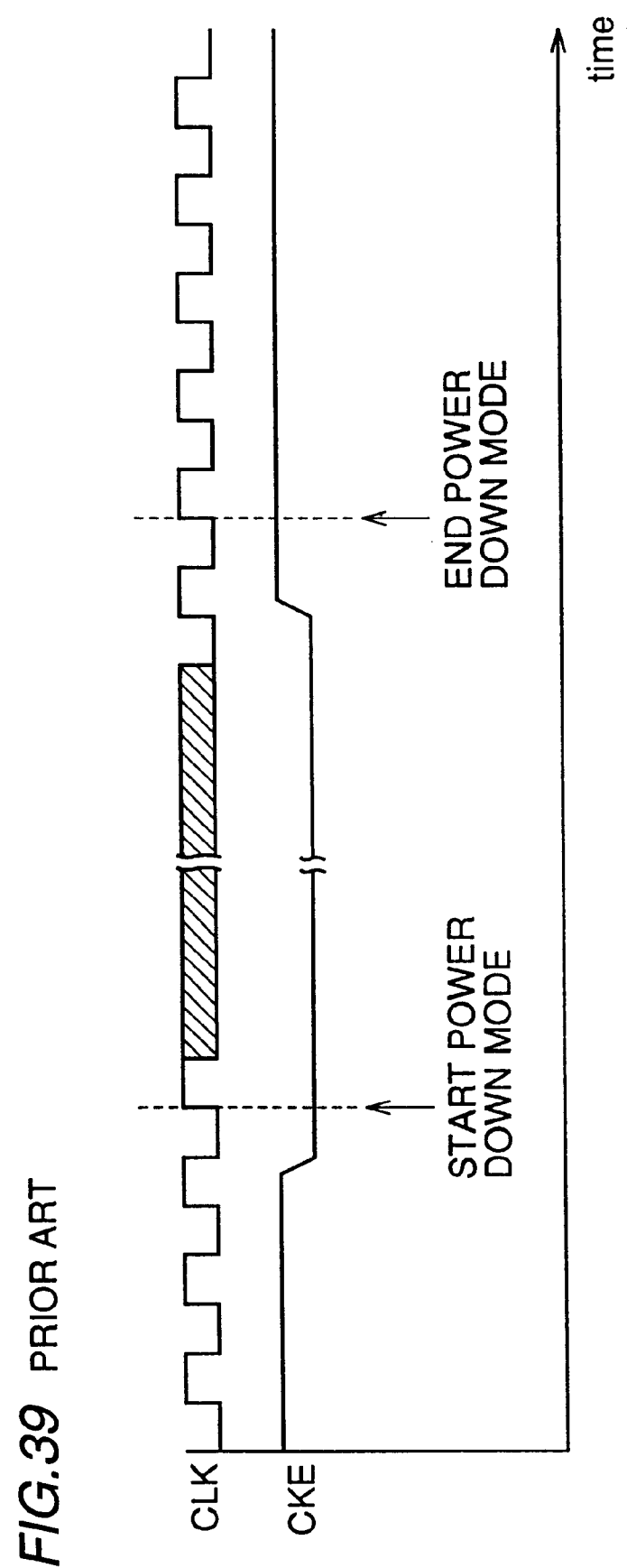
FIG. 39 is a timing chart for illustrating a power down mode of a conventional synchronous SDRAM.

The activation timing for the word line is described with reference to FIG. 34. When a first external clock EXTCLK goes high, the internal clocks CLK1 and CLK2 rise high at a timing delayed by a prescribed time. The active period of the internal clock CLK2 is shorter than that of the internal clock CLK1.

It is assumed that a chip selection signal /CS and a write enable signal /WE are low and an output enable signal /OE is high when the first external clock EXTCLK is captured. The write operation is executed for a memory cell corresponding to a captured address A0.

In this case, the word line activation signal generation circuit 93 raises a word line activation signal φWL corresponding to the address A0 when the internal clock CLK1 rises high, and lowers the word line activation signal φWL when the internal clock CLK1 falls low.

When a second external clock EXTCLK goes high, the internal clocks CLK1 and CLK2 rise high at a timing delayed by a prescribed time.

It is assumed that the chip selection signal /CS and the write enable signal /WE are high and the output enable signal /OE is low when the second external clock EXTCLK is captured. The read operation is executed for a memory cell corresponding to a captured address A1.

In this case, the word line activation signal generation circuit 94 raises a word line activation signal φWL1 corresponding to the address A1 when the internal clock CLK2 rises high, and lowers the word line activation signal φWL1 when the internal clock CLK2 falls low.

Thus, column current flowing from a bit line to the selected memory cell can be reduced by activating the word line only in the active period of the internally generated clock signal. Further, the write operation is ended in a shorter time as compared with the case of performing reading with weak memory cell current. Therefore, the active period of the word line in writing is reduced as compared with that in reading. Thus, power consumption in writing can be further reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a static semiconductor memory device selected in response to a chip selection signal for operating in synchronization with a clock signal; and
   a controller for controlling operations of said static semiconductor memory device, wherein
   said controller switches said static semiconductor memory device to a power down mode by switching said chip selection signal to a nonselective state and thereafter stepping down a power supply voltage supplied to said static semiconductor memory device from an operating supply potential to a standby potential.

2. The semiconductor integrated circuit according to claim 1, wherein
   said controller steps down said power supply voltage to said standby potential after a lapse of a first prescribed period after switching said chip selection signal to said nonselective state when switching said static semiconductor memory device to said power down mode and switches said chip selection signal to a selective state after a lapse of a second prescribed period after stepping up said power supply voltage to said operating potential when switching said static semiconductor memory device from said power down mode to an operating mode.

3. The semiconductor integrated circuit according to claim 2, wherein
   said controller stops change of a control signal supplied to said static semiconductor memory device when switching said static semiconductor memory device to said power down mode.

4. The semiconductor integrated circuit according to claim 1, wherein
   said controller fixes said clock signal to a prescribed level after a lapse of a first prescribed period after switching said chip selection signal to said nonselective state and steps down said power supply voltage to said standby potential after a lapse of a second prescribed period when switching said static semiconductor memory device to said power down mode.

5. The semiconductor integrated circuit according to claim 4, wherein
   said controller generates said clock signal after a lapse of a third prescribed period after stepping up said power supply voltage to said operating potential and switches said chip selection signal to a selective state after a lapse of a fourth prescribed period when switching said static semiconductor memory device from said power down mode to an operating mode.

6. The semiconductor integrated circuit according to claim 1, wherein
   said controller steps down said power supply voltage to said standby potential after a lapse of a first prescribed period after switching said chip selection signal to said nonselective state and fixes said clock signal to a prescribed level after a lapse of a second prescribed period when switching said static semiconductor memory device to said power down mode.

7. The semiconductor integrated circuit according to claim 6, wherein
   said controller generates said clock signal, steps up said power supply voltage to said operating potential after a lapse of a third prescribed period and switches said chip selection signal to a selective state after a lapse of a fourth prescribed period when switching said static semiconductor memory device from power down mode to an operational mode.

8. The semiconductor integrated circuit according to claim 1, further comprising a sense circuit for sensing whether or not said power supply voltage is stepped down beyond a sense level, wherein
   said static semiconductor memory device includes an input buffer capturing an input signal, and
   said input buffer is inactivated on the basis of a sense result of said sense circuit.

9. The semiconductor integrated circuit according to claim 8, wherein
   said sense circuit includes:
   a set potential sense circuit including a first PMOS transistor having a gate receiving a reference potential and a source node receiving said power supply voltage and a diode-connected NMOS transistor connected between a drain node of said first PMOS transistor and a ground potential,
   a reference potential generation circuit including a second PMOS transistor having a source node receiving said power supply voltage and a drain node and a gate connected with each other and a capacitive element and a resistive element connected in parallel between said drain node of said second PMOS transistor and a ground potential, and
   a differential compare circuit outputting a signal indicating whether or not said power supply voltage is stepped down beyond the total of the threshold of said NMOS transistor and the threshold of said second PMOS transistor on the basis of a signal from said drain node of said first PMOS transistor and a signal from said drain node of said second PMOS transistor.

10. A semiconductor integrated circuit system comprising:
    a static semiconductor memory device selected in response to a chip selection signal for operating in synchronization with a clock signal;
    a backup circuit supplying backup power to said static semiconductor memory device following step-down of a power supply voltage supplied to said static semiconductor memory device;
    a stabilizing circuit for stepping down said power supply voltage when said power supply voltage is stepped up beyond a prescribed value;
    a backup controller sensing abrupt step-down of said power supply voltage and switching said chip selection signal to a nonselective state; and
    a controller for switching said static semiconductor memory device to a power down mode/operating mode.

11. The semiconductor integrated circuit system according to claim 10, wherein
    said controller switches said chip selection signal to said nonselective state when switching said static semiconductor memory device to said power down mode.

12. The semiconductor integrated circuit system according to claim 11, wherein
    said controller fixes said clock signal to a prescribed level when switching said static semiconductor memory device to said power down mode.

13. The semiconductor integrated circuit system according to claim 10, further comprising:
    a first power supply node for supplying said power supply voltage, and a second power supply node electrically connected with said static semiconductor memory device, wherein said backup controller includes:
a detection circuit detecting a voltage drop on said first power supply node, and
a circuit switching said chip selection signal to said nonselective state in response to a result of detection of said detection circuit,
said backup circuit includes:
a power supply circuit, and
a first zener diode turned on following step-down of said power supply voltage for electrically connecting said power supply circuit and said second power supply node with each other, and
said stabilizing circuit includes:
a first bipolar transistor connected between said first power supply node and said second power supply node,
a second bipolar transistor turned on in response to the result of detection in said detection circuit,
a resistive element connected between the base of said first bipolar transistor and the collector of said second bipolar transistor, and
a second zener diode connected between the emitter of said second bipolar transistor and ground power.

14. The semiconductor integrated circuit system according to claim 11, wherein
said controller switches a snooze mode signal for setting said static semiconductor memory device in a snooze mode to an active state when switching said static semiconductor memory device to said power down mode.

15. A semiconductor integrated circuit comprising:
a generation circuit generating a first internal clock synchronous with an external clock and a second internal clock obtained by delaying said first internal clock;
a memory cell array including memory cells arranged in rows and columns, a plurality of word lines corresponding to said rows and a plurality of pairs of bit lines corresponding to said columns; and
a word line activation signal generation circuit activating a word line activation signal supplied to selected said word line, wherein
said word line activation signal generation circuit decides an active period of said word line activation signal in response to edges of said first internal clock and said second internal clock.

16. The semiconductor integrated circuit according to claim 15, wherein
said word line activation signal generation circuit activates said word line activation signal on the leading edge of said first internal clock.

17. The semiconductor integrated circuit according to claim 16, wherein
said word line activation signal generation circuit inactivates said word line activation signal on the leading edge of said second internal clock or on the next leading edge of said first internal clock.

18. The semiconductor integrated circuit according to claim 15, wherein
said word line activation signal generation circuit activates said word line activation signal on the leading edge of said second internal clock.

19. The semiconductor integrated circuit according to claim 18, wherein
said word line activation signal generation circuit inactivates said word line activation signal on the trailing edge of said first internal clock.

20. The semiconductor integrated circuit according to claim 15, wherein
said word line activation signal generation circuit includes:
a first signal generation circuit activating a first word line activation signal supplied to a word line subjected to a write operation of said memory cell array, and
a second signal generation circuit activating a second word line activation signal supplied to a word line subjected to a read operation of said memory cell array, and
an active period of said first word line activation signal is shorter than an active period of said second word line activation signal.

* * * * *